(12) United States Patent
Suzuki et al.

(10) Patent No.: US 6,677,549 B2
(45) Date of Patent: Jan. 13, 2004

(54) PLASMA PROCESSING APPARATUS HAVING PERMEABLE WINDOW COVERED WITH LIGHT SHIELDING FILM

(75) Inventors: Nobumasa Suzuki, Kanagawa (JP); Shinzo Uchiyama, Tochigi (JP); Hideo Kitagawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 09/906,231

(22) Filed: Jul. 17, 2001

(65) Prior Publication Data

US 2002/0008088 A1 Jan. 24, 2002

(30) Foreign Application Priority Data

Jul. 24, 2000 (JP) ........................... 2000-222076
Jul. 24, 2000 (JP) ........................... 2000-222195

(51) Int. Cl.⁷ .............................................. B23K 10/00
(52) U.S. Cl. ........................ 219/121.41; 219/121.43; 219/121.55
(58) Field of Search ................... 219/121.41, 121.43, 219/121.4, 121.55; 118/723 MW, 723 ME, 723 MA, 50.1; 422/186.29, 906; 156/345.42, 345.41, 345.34; 438/707–710, 728

(56) References Cited

U.S. PATENT DOCUMENTS

| | | | |
|---|---|---|---|
| 4,776,918 A | * 10/1988 | Otsubo et al. | 156/345.41 |
| 4,985,109 A | * 1/1991 | Otsubo et al. | 156/345.41 |
| 5,034,086 A | 7/1991 | Sato | 156/345.34 |
| 5,359,177 A | 10/1994 | Taki et al. | 219/121.43 |
| 5,538,699 A | 7/1996 | Suzuki | 422/186.29 |
| 5,803,975 A | 9/1998 | Suzuki | 118/723 MW |
| 6,497,783 B1 | * 12/2002 | Suzuki et al. | 156/345.34 |

FOREIGN PATENT DOCUMENTS

| | | |
|---|---|---|
| EP | 0 564 359 | 10/1993 |
| EP | 0 880 164 | 11/1998 |
| JP | 1-184923 | 7/1989 |
| JP | 3-262119 | 11/1991 |
| JP | 5-290995 | 11/1993 |
| JP | 5-345982 | 12/1993 |
| JP | 7-90591 | 4/1995 |
| JP | 11-40397 | 2/1999 |

* cited by examiner

Primary Examiner—Quang T. Van
(74) Attorney, Agent, or Firm—Fitzpatrick, Cella, Harper & Scinto

(57) ABSTRACT

To provide a production method of a structure with which a degradation of a processing speed is suppressed and plasma processing is performed with using a reliable plasma processing apparatus and which is excellent in repeatability, a plasma processing apparatus, which includes a container whose inside can be exhausted and a gas supply port for supplying a process gas to the container and subjects to plasma processing an object to be processed placed in the container, is characterized in containing a light shielding film that disturbs the incidence of light, which may increase dielectric loss of a permeable window, to this dielectric window on the internal surface of the permeable window permeating high frequency energy for generating the plasma of the above-described gas, and is provided in the above-described container.

17 Claims, 9 Drawing Sheets

PLASMA PROCESSING APPARATUS HAVING PERMEABLE WINDOW COVERED WITH LIGHT SHIELDING FILM

BACKGROUND OF THE INVENTION

1. Field of the Invention

The present invention relates to a plasma processing apparatus which gives plasma processing to a processed object with using high frequency energy such as a microwave, and in particular, to a plasma processing apparatus equipped with a window permeated by high frequency energy, a plasma processing method, a dielectric for a permeable window used therefor, and a production method of a structure where the dielectric for a permeable window is used.

2. Related Background Art

As a plasma processing apparatus using high frequency energy such as a microwave and a VHF wave as an excitation source for plasma excitation, a plasma polymerization apparatus, a CVD apparatus, a surface treatment apparatus, an etching apparatus, an ashing apparatus, a cleaning apparatus, etc. are known.

To cite a case of a microwave as an example, CVD using such a so-called microwave plasma processing apparatus is performed as follows.

That is, a gas is introduced into a plasma-generating chamber and/or a film-forming chamber of microwave plasma CVD apparatus, and microwave energy is supplied simultaneously to generate plasma in the plasma generation chamber. Furthermore, the gas is excited, dissociated, and ionized, and the like to generate ions, radicals, etc., and a deposition film is formed on the processed object arranged in the plasma generation chamber or the film formation chamber distant from the plasma generation chamber. In addition, surface treatment such as plasma polymerization, oxidization, nitriding, and fluoridation of an organic substance can be also performed by the same technique.

Moreover, the etching processing of the processed object using the so-called microwave plasma etching apparatus is performed, for example, as follows. That is, an etching gas is introduced into the processing chamber of this apparatus, and microwave energy is supplied simultaneously to generate plasma in this processing chamber. In addition, the etching gas is excited, dissociated and ionized to etch a surface of the processed object arranged in this processing chamber by the ions, radicals, etc. that are generated.

Moreover, the ashing processing of the processed object that uses a so-called microwave plasma-ashing apparatus is performed, for example, as follows. That is, an ashing gas is introduced into the processing chamber of this apparatus, and microwave energy is supplied simultaneously to generate plasma in this processing chamber. In addition, the ashing gas is excited, dissociated and ionized to ash a face of the processed object arranged in this processing chamber, that is, photo resist by the ions, radicals, and ozone etc. that are generated. Similarly to the ashing, it is possible to perform cleaning for removing an undesired substance adhering to the processed face of the processed object.

In a microwave plasma processing apparatus, since a microwave is used as a source of gas excitation, electrons can be accelerated by an electric field at a high frequency, and hence gas molecules can be ionized and excited efficiently. So, since having high gas ionization efficiency, excitation efficiency, and dissociation efficiency, the microwave plasma processing apparatus has such advantages that it is possible to form high-density plasma comparatively easily and that it is possible to perform quality processing at high speed and low temperature. Moreover, the apparatus also has such advantages that, since a microwave permeates a dielectric like silica glass, the plasma processing apparatus can be constituted as an electrodeless discharge type apparatus and that, owing to this, highly clean plasma processing can be performed.

In order to further accelerate such a microwave plasma processing apparatus, a plasma processing apparatus using electron cyclotron resonance (ECR) has also been put in practical use. The ECR is a phenomenon in which, when flux density is 87.5 mT, an electronic cyclotron frequency that is a frequency of electrons revolving around lines of magnetic force meets a common microwave frequency of 2.45 GHz, the electrons absorbs microwaves resonantly to be accelerated, and high-density plasma is generated.

Moreover, another type of plasma processing apparatus for high-density plasma generation is also proposed.

For example, plasma-processing apparatuses each using a radial line slot antenna (RLSA) are disclosed in Japanese Patent Application Laid-Open No. 03-262119, Japanese Patent Application Laid-Open No. 01-184923, and the specification of U.S. Pat. No. 5,034,086.

Alternatively, plasma processing apparatuses each using a circular wave guide with termination are disclosed in Japanese Patent Application Laid-Open No. 05-290995, the specification of U.S. Pat. No. 5,359,177, and EPO564359 bulletin.

Apart from these, as examples of microwave plasma processing apparatuses in recent years, apparatuses each using a circular wave guide without termination where a plurality of slots is formed in the inside thereof are proposed as apparatuses of uniformly and effectively introducing microwaves (Japanese Patent Application Laid-Open No. 5-345982 and U.S. Pat. No. 5,538,699).

On the other hand, a plasma processing apparatus using a disk-like microwave introduction apparatus is disclosed in Japanese Patent Application Laid-Open No. 7-90591. This apparatus introduces a gas into a wave guide, and discharges the gas toward a plasma generation chamber from slots provided in the wave guide.

Moreover, a plasma processing apparatus equipped with a circular (annular) wave guide is also disclosed in Japanese Patent Application Laid-Open No. 11-40397.

On the other hand, FIGS. 9 to 12 are schematic diagrams showing an example of a conventional plasma processing apparatus.

FIG. 9 shows a container 1 whose inside can be exhausted, supporting means 2 for a processed object, a microwave source 3 consisting of a circular wave guide having a circular wave guide therein, a dielectric window 4, and a gas supply pipe 7 having a gas supply port 7a. An apparatus assembled from these parts introduces a microwave from the microwave introduction port 15 of the microwave source 3 to supply the microwave from the slots 3b to the container 1 through the dielectric window 4.

FIGS. 10 to 12 are schematic diagrams for explaining the propagation of a microwave in a circular wave guide of the microwave source, and the situation of radiation of the microwaves from the slots.

FIG. 10 shows the situation at the time of seeing the circular wave guide from the above with omitting the slots. FIG. 11 shows a cross section taken on line 11—11 in FIG. 10, and FIG. 12 shows a cross section taken on line 12—12.

Since the vicinity of the microwave introduction port 15 serves as an equivalent circuit of E-plane T-junction, the microwave introduced from the microwave introduction port 15 is changed on its course in a clockwise direction d2 and a counterclockwise direction d1. Since each slot 3b is provided so as to intersect with the proceeding directions d1 and d2 of the microwave, the microwave proceeds with emitting microwaves from the slots.

Since the circular wave guide is without termination, the microwaves propagating in the directions d1 and d2 (z-axis direction) interfere with each other. It becomes easy to generate a standing wave in a desired mode by making the length of a ring C1 formed by connecting centers of the wave guide, that is, circumference be an integral multiple of a guide wavelength (wavelength in the guide).

FIG. 11 shows a cross section perpendicular to a proceeding direction (z-axis orientation) of the microwave, and upper and lower faces 3c of the wave guide are H-plane perpendicular to the direction of an electric field EF. In addition, left and right faces 3d of the wave guide are E-plane parallel to the direction of the electric field EF. Reference symbol C0 denotes a center in the longitudinal direction of the slot 3b, i.e., the direction (x-axis direction) perpendicular to the proceeding direction and propagating direction of the microwave.

Thus, the cross section of the wave guide, which is perpendicular to the microwave proceeding direction, is a rectangle cross section whose long side and short side are the x-axis and the y-axis respectively.

A microwave MW introduced in the circular wave guide 3a is divided into the right and left by an E-plane T-junction distribution block 10, and propagates at guide wavelength longer than that in a free space. The distributed microwaves interfere with each other in facing sections, and hence generate a standing wave every half of the guide wavelength. A leakage wave EW emitted through the dielectric window 4 from the slot 3b provided in a position where the electric field crossing the slot becomes the maximum generates plasma P1 near the slot 3b. When an electronic frequency of the generated plasma P1 exceeds a frequency of a microwave power supply (when, for example, a frequency of the power supply is 2.45 GHz, electron density exceeds $7 \times 10^{10}$ cm$^{-3}$), the microwave cannot propagate in the plasma, that is, cut-off arises. The microwave propagates on the boundary between the dielectric window 4 and plasma as a surface wave SW. Surface waves SW introduced from adjoining slots interfere with each other, and a loop of an electric field is produced every half the wavelength of the surface wave SW ($\lambda \cdot \epsilon \gamma^{-1/2}$ [$\lambda$: free space microwave wavelength; $\epsilon \gamma$: dielectric constant]). This loop electric field caused by the interference of surface waves leaking out to the plasma generating space side 1 generates surface-wave interfered plasma (SIP) P2. If a process gas is introduced into the plasma processing chamber at this time, the process gas is excited, dissociated, and ionized by the high-density plasma generated, and can process the face of the processed object.

Such a microwave plasma processing apparatus can generates high-density low-electron temperature plasma having electron density of $10^{12}$/cm$^3$ or more, electron temperature of 3 eV or less, and plasma potential is 20 V or less within the uniformity of ±3% in a space where pressure is about 1.33 Pa, microwave power is 1 kW or more, and its diameter is 300 mm or more.

Therefore, it is possible to supply the gas to the processed object in an active condition by fully reacting the gas.

In addition, when pressure is $2.7 \times 10^3$ Pa and microwave power is 2 kW, it becomes impossible to detect current caused by the plasma in the position over 50 mm apart from the internal surface of the dielectric window. This means that a layer of very thin plasma is made near the dielectric window in the high pressure area in which plasma diffusion is suppressed. Therefore, since the surface damage of a substrate by incident ions also decreases, high-quality and high-speed processing becomes possible even at low temperature.

In plasma processing apparatus, quartz glass (silicon oxide), alumina (aluminum oxide), aluminum nitride, or the like is used as a dielectric window without being dependent on the configuration of a microwave source.

However, quartz glass is easily vulnerable by a gas with fluorine content like $C_4F_8$ used for etching, etc.

Although the dielectric constant of alumina is higher than that of quartz and is also superior in the durability over a gas with fluorine content, its thermal conductivity is low and coefficient of thermal expansion is high. Hence alumina is comparatively easy to be broken by ion incidence from plasma.

Although there is no problem like alumina in an aluminum nitride, the transmissivity of a microwave might lower gradually with the time and plasma-processing speed might become low.

As described above, it is not sufficient for providing a superior plasma processing apparatus just to choose the material constituting a dielectric window.

SUMMARY OF THE INVENTION

An object of the present invention is to provide a plasma processing apparatus, a plasma processing method, and a dielectric for a permeable window that make processing speed hardly lowered.

Another object of the present invention is to provide a production method of a structure in which plasma processing is performed with using a reliable plasma processing apparatus and which is excellent in repeatability.

The main point of a plasma processing apparatus according to the present invention is characterized in that, in the plasma processing apparatus that has a container a gas supply port that supplies a process gas in the above-described container and a permeable window permeating high frequency energy for generating the plasma of the gas, a light shielding film for shielding the window from light, which may increase dielectric loss of a permeable window, is provided on the internal surface of the window.

The main point of another plasma processing apparatus according to the present invention is characterized in that.

In the plasma processing apparatus that has a container a gas supply port that supplies a process gas in the above-described container and a reflective film that reflects incident light, which may increase the dielectric loss of a permeable window, on the internal surface of the permeable window permeating microwave energy for generating the plasma of the above-described gas.

The main point of still another plasma processing apparatus according to the present invention is characterized in that, in the plasma processing apparatus that has a container a gas supply port that supplies a process gas in the above-described container and an optical absorption film that absorbs incident light, which may increase the dielectric loss of a permeable window, on the internal surface of a microwave permeable window permeating microwave energy for generating the plasma of the above-described gas.

Furthermore, the main point of a dielectric for a permeable window according to the present invention is characterized in that a light shielding film for shielding the window from light that may increase the dielectric loss is provided on at least one surface thereof.

The main point of another dielectric for a permeable window according to the present invention is characterized in that a reflective film reflecting light that may increase dielectric loss is provided on at least one surface thereof.

The main point of still another dielectric for a permeable window according to the present invention is characterized in that an optical absorption film absorbing light, which may increase dielectric loss, is provided on at least one surface thereof.

With citing an example at the time of using aluminum nitride for a dielectric window, an action of the light shielding film that can be used in the present invention will be described.

For example, a mechanism of dielectric loss (tanδ) arising in a microwave wavelength region of aluminum nitride is considered to be that pairs of impurity, which is replaced from nitrogen, and an aluminum vacancy are formed in an aluminum nitride crystal, and impurity oxygen ionized vibrates with response to an external electric field.

Although an ionization rate by oxygen heated at several hundred degrees centigrade is not so high, an ionization rate by light at 2.0 eV to 2.8 eV (this is equivalent to 440 nm to 600 nm) is high.

Moreover, the radiation within the above-described wavelength range is found in the plasma used for plasma processing.

Therefore, it is considerable that impurity oxygen is ionized by the strong light emitted from high-density plasma by the microwave permeable window made from aluminum nitride, and dielectric loss increases. Probably, there may be some materials besides aluminum nitride where dielectric loss arises by the similar mechanism.

According to the present invention, by providing a light shielding film that disturbs the incidence of light, causing the increase of dielectric loss, into a permeable window, it becomes possible to suppress the dielectric loss caused by the permeable window and the time-dependent degradation of processing speed.

As a light shielding film used in the present invention, a film can be cited, the film which can reduce the amount of incidence of light causing the increase of dielectric loss in a permeable window among the plasma light which is incident to the permeable dielectric window made of aluminum nitride or the like. In more detail, what is preferably used is an optical absorption film that may absorb the light that becomes a cause of increasing the dielectric loss, a reflective film that may reflect the light being the cause of increasing the dielectric loss, or the combination of the above-mentioned optical absorption film and the above-mentioned reflective film.

DETAILED DESCRIPTION OF THE PREFERRED EMBODIMENTS (Embodiment 1)

Figure 1:
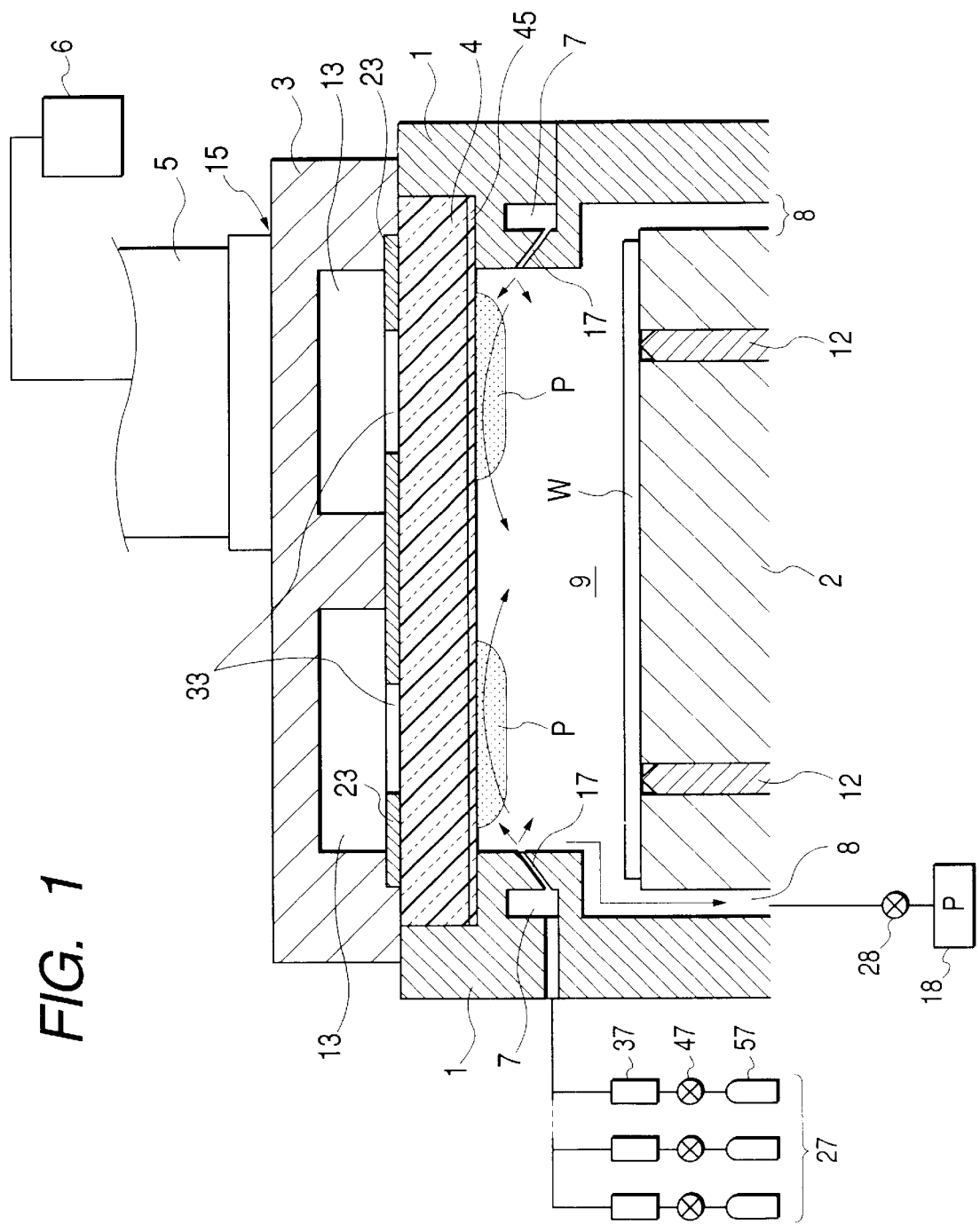
FIG. 1 is a sectional view showing a plasma processing apparatus according to the present invention.

FIG. 1 is a schematic sectional view showing a plasma processing apparatus according to a first embodiment of the present invention. A container 1 is a vacuum housing that contains a processed object W therein and can generate plasma in a plasma generating space 9, and for example, is a container intercepted from the atmosphere by an air open type housing or a load lock chamber that is adjacently provided and is not shown.

Processed-object holding means 2 is called a susceptor or holder for containing and holding the processed object W in the container 1, and has lift pins 12 which can raise and lower the processed object W. Although the tip of each lift pin is drawn needlelike in the drawing, the tip touching the processed object may have the shape of a plane nail head. Furthermore, temperature control means such as a heater for heating the processed object W, or a cooler for cooling the processed object can be attached to the holding means 2 if needed.

A high frequency energy source 3 supplies high frequency energy for generating plasma in the container 1, and a microwave source supplying microwave energy here is illustrated. The microwave source here adopted is internally equipped with a circular wave guide without termination, and its circumference is made to be the integral multiple of the guide wavelength of a microwave.

A microwave permeable window 4 is a high frequency energy permeable window that makes a microwave permeate while hermetically sealing the inside of the container 1 and consists of a dielectric.

Reference numerals 5 and 6 denote a microwave wave guide and a microwave power supply as an RF generator respectively.

A gas supply way 7 is a way for supplying a process gas to be made plasma by a microwave and has a gas supply port 17 at the end of an emitting way that turns obliquely upward.

The gas supply way 7 communicates with a gas supply system 27 consisting of various chemical cylinders 57, valves 47, flow controllers 37, and the like.

An exhaust way 8 for exhausting the inside of the container 1 communicates through an exhaust port, not shown, with an exhaust system including a vacuum pump 18, a valve 28, and the like.

Figure 2:
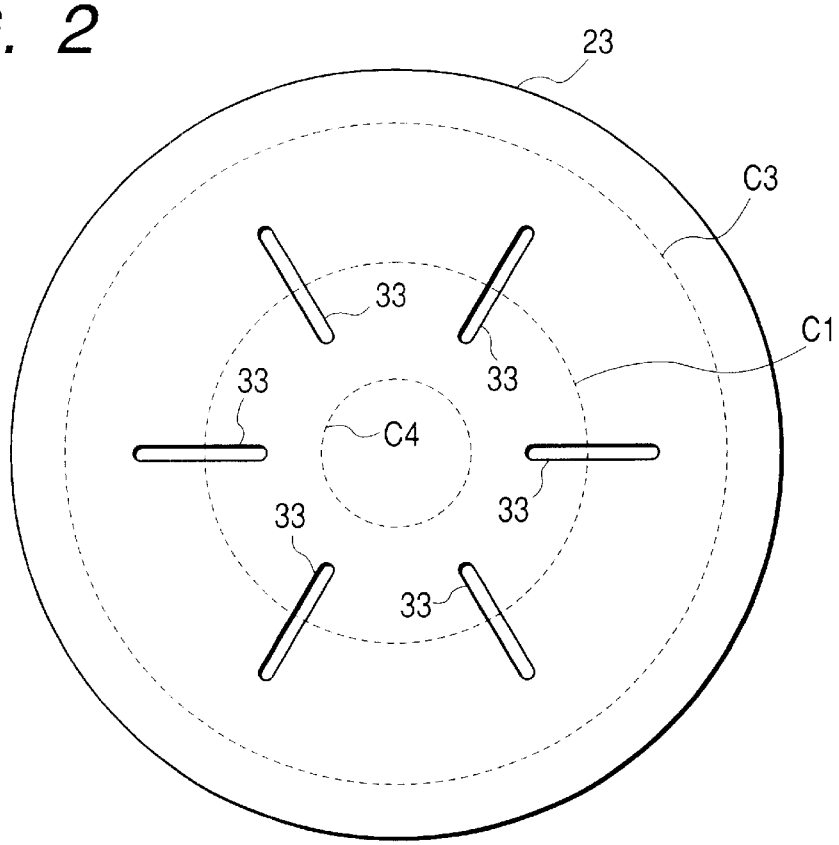
FIG. 2 is a plan showing another example of a plate with slots used in the present invention.

FIG. 2 shows a plate 23 with slots used in the microwave source 3 of the apparatus shown in FIG. 1.

The plate 23 with slots is also called a slot antenna, and has a plurality of slots 33 in the surface. The slots are provided on the line that connects the centers C1 of the circular wave guide 13. Reference symbols C3 and C4 denote the outer surface of the circular wave guide 13, and the inner surface respectively.

A plasma processing method by the apparatus shown in FIG. 1 is as follows. A process gas is supplied from the gas supply port 17 into the container 1 where pressure is reduced and exhausted to predetermined pressure.

The process gas flows into the exhaust way 8, after being released to the space 9 becoming a plasma generation chamber.

On the other hand, the microwave generated in the microwave power supply 6 like a magnetron propagates through a wave guide 5 such as a coaxial wave guide, a cylindrical wave guide, or a rectangular wave guide, and is introduced into the microwave source 3 from the introductory port 15.

The microwave introduced from the upper H-plane facing one slot 33 propagates inside the circular wave guide 13 without termination in the microwave source 3 clockwise or counterclockwise in FIG. 2 while emitting a microwave from the slot 33.

Since the longwise slot 33 that intersects the propagation and proceeding direction of the microwave that propagates and advances inside the wave guide in, for example, the $TE_{10}$ mode is formed in H-plane of the circular wave guide 13, the microwave is emitted from the slot 33 toward the space 9. If the circumference of the circular wave guide 13 is made to be the integral multiple of the wave length in a wave guide and the slots 33 are arranged at least every half or quadrant interval of the guide wavelength, a standing wave occurs in the wave guide 13, and microwaves are emitted from the slots. In order to make the radiation of a microwave from a slot preferential, it is good to make a circumference be the integral multiple of the guide wavelength and to provide in positions, which cross the surface current that is caused by the microwave and flows the H-plane, slots at intervals of half of the surface wave length.

Alternatively, in order to make the use of interference of surface waves, which are radiated from slots and propagate along a dielectric window, preferential, it is good to provide in positions, which cross the surface current that is caused by the microwave and flows the H-plane, slots at intervals of half of surface wave length.

The microwaves permeate the microwave permeable window 4 consisting of a dielectric to be supplied to the space 9.

Figure 12:
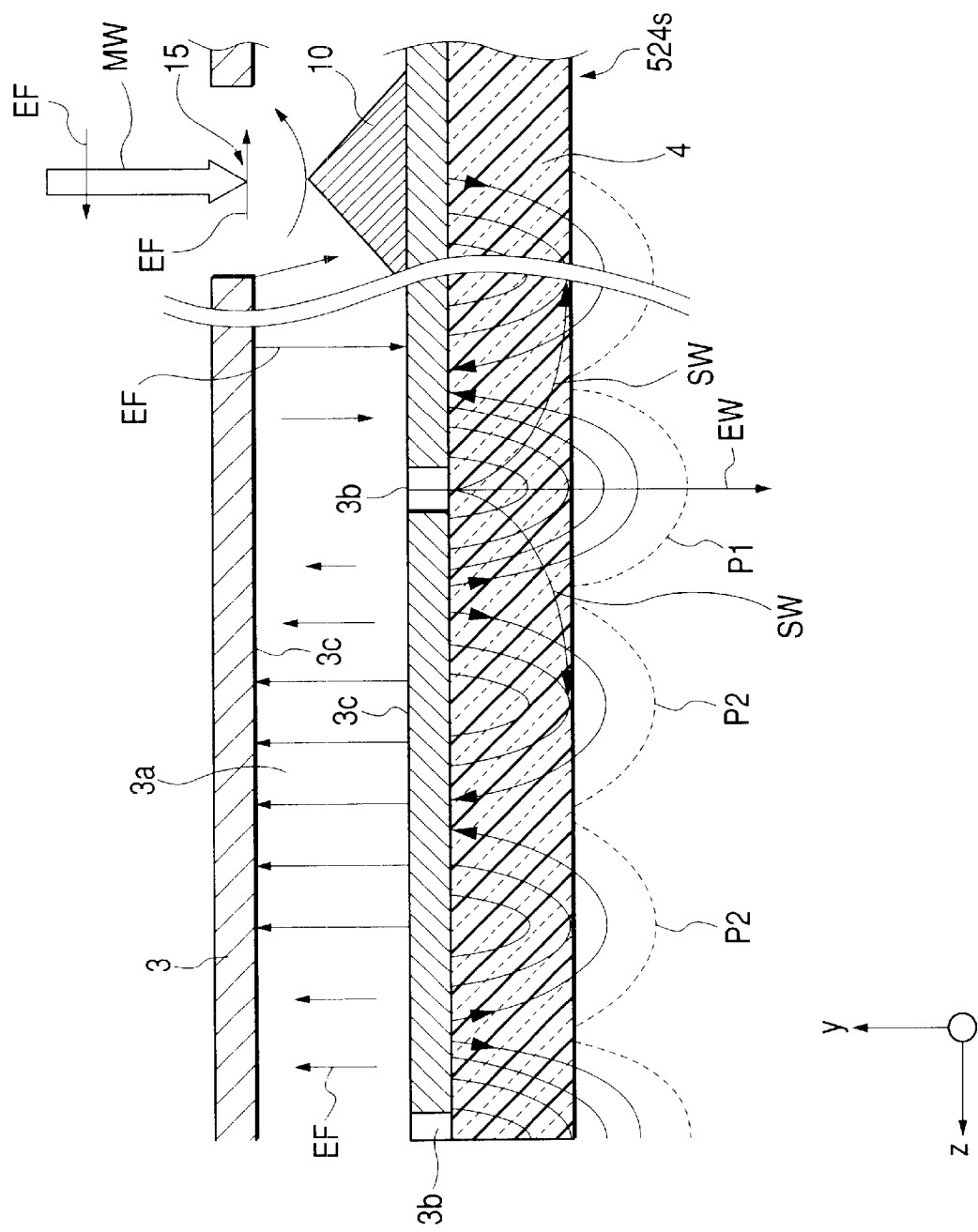
FIG. 12 is a sectional view showing the situation of microwave radiation that is taken on line 12—12 in FIG. 10.

Since the process gas exists in the space 9, this process gas is excited by microwave energy, and plasma is generated. The structure of radiation of microwaves and plasma generation is as described with reference to FIG. 12.

Surface treatment is performed on the surface of the processed object W with using this plasma. According to the power of the microwave supplied, or the pressure in the container, plasma P may exist only in a lower part of the slot as shown in FIG. 1, and may spread all over the undersurface of the window 4. Furthermore, it is also possible to extend deeply even near the processed object.

Moreover, in the present invention, slots can be also made unevenly distributed outside according to the size of the processed object W, and the circumference of the microwave source wave guide.

In addition, a light shielding film 45 is formed inside the microwave permeable window 4.

(Light Shielding Film)

As the light shielding film 45 used in the present invention, a film can be cited, the film which can reduce the amount of incidence of light, causing the increase of dielectric loss in the permeable window 4, among the plasma light entering into the permeable window 4 made of a dielectric such as aluminum nitride. In more detail, the light shielding films to be preferably used are an optical absorption film that may absorb the light becoming the cause of increasing the dielectric loss, a reflective film that may reflect the light becoming the cause of increasing the dielectric loss, or the combination of the above-mentioned optical absorption film and the above-mentioned reflective film.

(Reflective Film)

When using a reflective film as the light shielding film 45, the reflective film can be a single film or a laminated film consisting of a plurality of layers whose refraction indices differ mutually.

All the reflective film has to be are to be a film that has microwave permeability and can reflect the light that may increase the dielectric loss in a microwave permeable window. For example, what is necessary is just to be a film that can reflect light in a wave length range of 400 nm to 600 nm. For example, when using aluminum nitride for a microwave permeable window, what is necessary is just to be a film that can reflect light in a wave length range of 440 nm to 500 nm. More preferably, film thickness can be determined so that a reflection factor becomes 80% or more in this wave length range, or more preferably, 90% or more.

Specifically, what are cited as dielectrics each having a high refraction index are dielectrics such as aluminum oxide, neodymium fluoride, cerium fluoride, lanthanum fluoride, and lead fluoride.

What are cited as dielectrics each having a low refraction index are dielectrics such as aluminum fluoride, magnesium fluoride, calcium fluoride, lithium fluoride, and sodium fluoride.

When the film is a laminated film, the thickness df of each layer can be designed so that the thickness df may be set to be nearly $\lambda c/4\, nf$. Here, $\lambda c$ is the main wave length of the light to be reflected, and nf is a refraction index.

It is good to alternately stack six to twenty layers which are designed in such thickness and whose refraction indices are different from one another, and to make the top layer be a layer having a high refraction index. Furthermore, it is also possible to make a wave length range, effective in reflection, wider by changing little by little the main wave lengths $\lambda c$ in arbitrary layers.

When using a laminated film as a reflective film, it is good to make its top layer be a film excellent in oxygen plasma-proof property and fluorine plasma-proof property. Specifically, material to be selected is aluminum oxide, neodymium fluoride, cerium fluoride, lanthanum fluoride, or lead fluoride. It is good to make the thickness of this film be 100 nm to 10 μm.

Figure 3A:
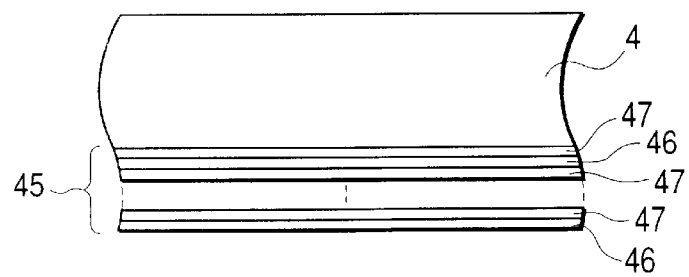
FIG. 3A is a schematic sectional view of a permeable window used in the present invention.

FIG. 3A shows an example of a laminated layer having a high refraction index layer 46 consisting of high refraction index material and a low refraction index layer 47 consisting of low refraction index material as the light shielding film 45.

In addition, the reflective film used in the present invention can be formed with using a well-known method such as sputtering, CVD, vacuum evaporation, and ion plating.

(Optical Absorption Film)

As the light shielding film 45, an optical absorption film can also be provided in the inside of the microwave permeable window 4.

The optical absorption film can be a single film or a laminated layer consisting of a plurality of films.

All the optical absorption film has to be is to be a film that has microwave permeability and can absorb the light that may increase the dielectric loss in a microwave permeable window. For example, what is necessary is just to be a film that can absorb light in a wave length range of 400 nm to 600 nm. For example, when using aluminum nitride for a microwave permeable window, what is necessary is just to be a film that can absorb light in a wave length range of 440 nm to 500 nm. More preferably, film thickness can be determined so that an absorption factor becomes 80% or more in this wave length range, or more preferably, 90% or more.

Specifically, the optical absorption film can consist of at least one kind of material chosen from among Si, Ge, C, SiGe, SiC, GaAs, InP, CdS, CdTe, AgCl, TlCl, and $SixN$ (here, x is larger than three fourths), and a dielectric such as glass with a metal ion content.

When using a semiconductor, non-single crystal silicon (polycrystal silicon, amorphous silicon, and microcrystal silicon) is preferably used, and in the case of a carbon film, diamond-like carbon or graphite is preferably used. These also can intentionally or unescapably contain atoms such as H, F, C, Ni, O, P, and B.

Assuming that a desired absorption coefficient is A and material consisting of a film is a, film thickness d is defined by $d=-\{\ln(1-A)\}\alpha^{-1}$. For example, assuming that A is 90% and $\alpha$ is 5 $\mu m^{-1}$, thickness d becomes 461 nm.

When using a laminated film as an optical absorption film, it is good to make its top layer be a film excellent in oxygen plasma-proof property and fluorine plasma-proof property. Specifically, the material to be chosen is aluminum oxide, aluminum fluoride, neodymium fluoride, cerium fluoride, lanthanum fluoride, lead fluoride, magnesium fluoride, calcium fluoride, lithium fluoride, or sodium fluoride.

It is good to make the thickness of this protective coat be 100 nm to 10 $\mu$m.

Figure 3B:
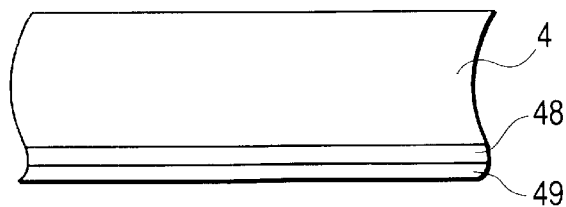
FIG. 3B is a schematic sectional view of another permeable window used in the present invention.

FIG. 3B shows an example of the optical absorption film consisting of a laminating film comprising the film 48 made of material having optical absorption property, and a protective coat 49 as the light shielding film 45.

In addition, the optical absorption film used in the present invention can be formed with using a well-known method such as sputtering, CVD, vacuum evaporation, and ion plating.

Furthermore, preferably, it is also good to adopt the configuration of stacking the above-described reflective film and optical absorption film as the light shielding film 45. In this case, the reflection factor of the reflective film does not need to be 80% or more, and the optical absorption factor of the optical absorption film does not need to be 80%, either. That is, the light transmittance as a light shielding film may just become about 20% or less, or more preferably 10% or less.

(Embodiment 2)

Next, a microwave source according to another embodiment of the present invention, which is equipped with a circular wave guide having a flat surface in which a plurality of slots for emitting microwaves is provided, is characterized in having discontinuous linear slots 33 and 43 which orient in the direction of crossing to the proceeding directions of microwaves.

Figure 4:
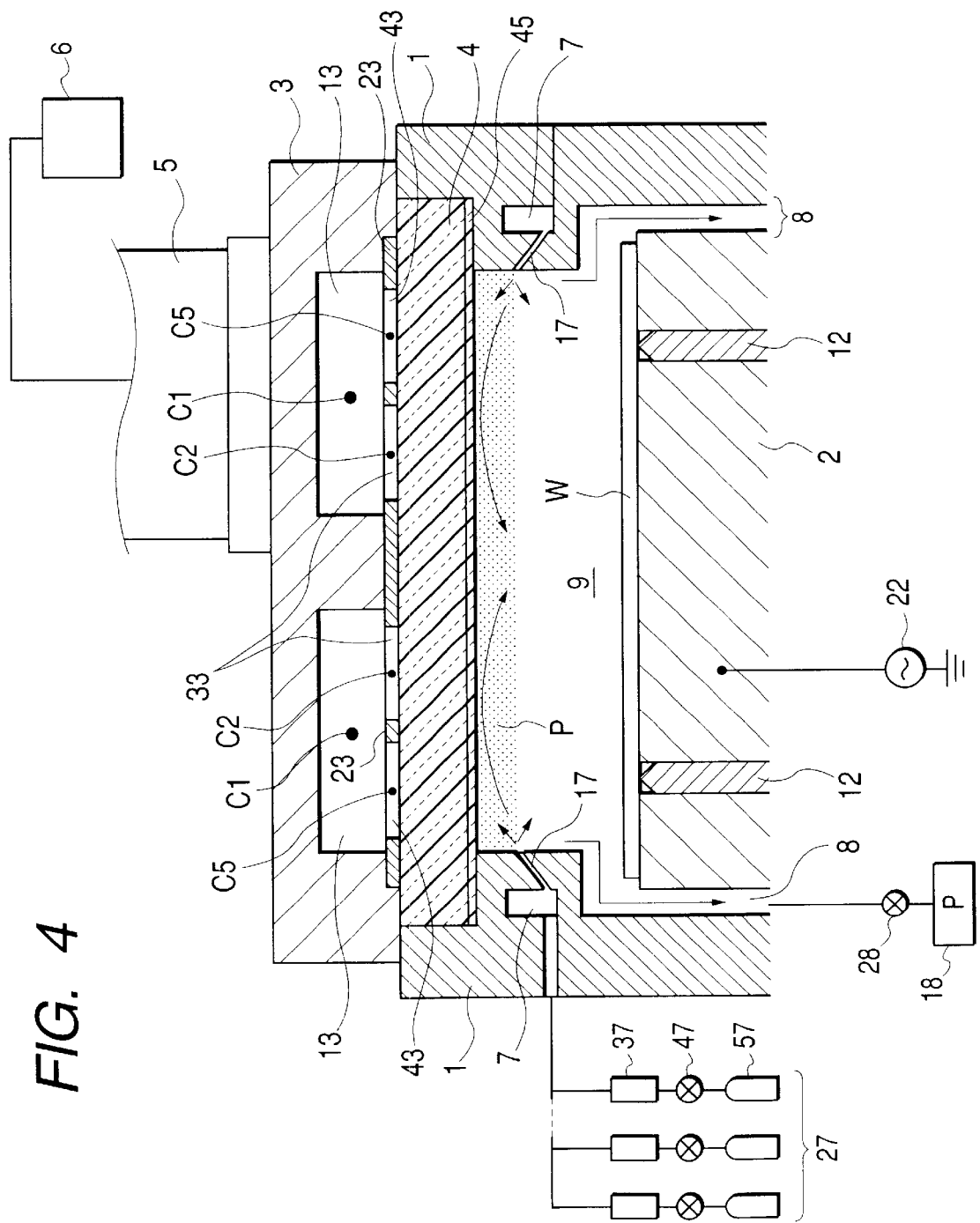
FIG. 4 is a sectional view showing another plasma processing apparatus according to the present invention.

FIG. 4 is a schematic sectional view showing such a plasma processing apparatus.

Figure 5:
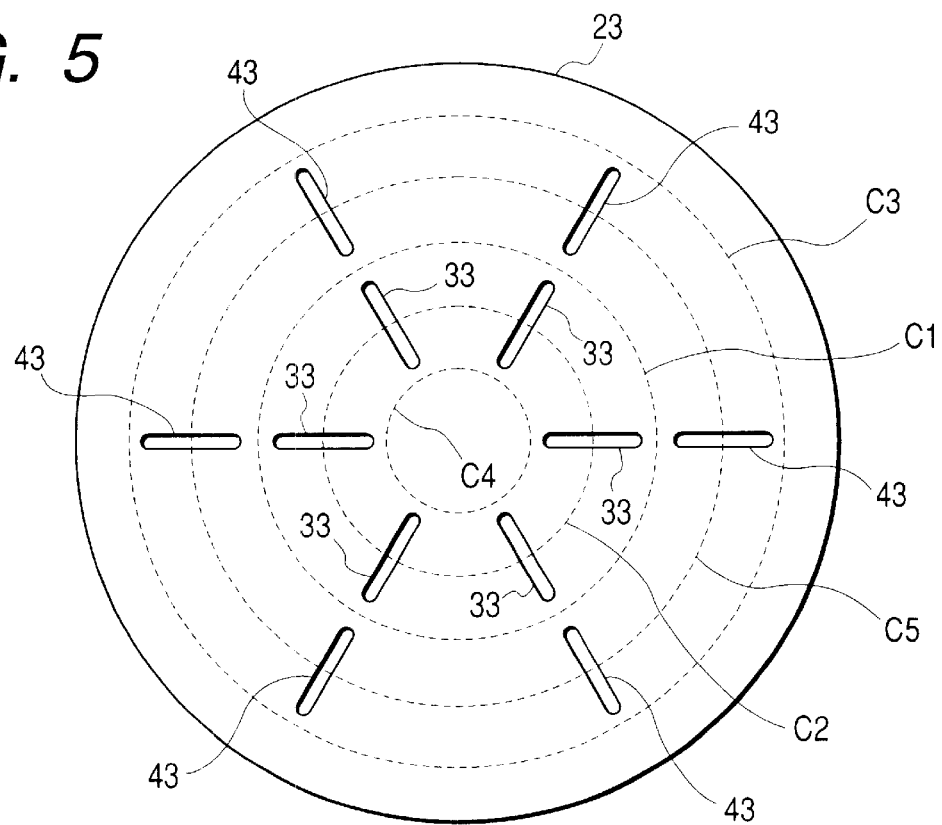
FIG. 5 is a plan showing another example of a plate with slots used in the present invention.

This apparatus has a plate 23 with slots as shown in FIG. 5. The differences from the apparatus in FIG. 1 are that the plate 23 with slots in FIG. 5 is attached, and that a bias power supply 22 for the processed object is attached.

This apparatus is configured so that pressure in the space 9 is made low so that plasma may further spread, and plasma processing can be performed with applying bias voltage to the processed object W from a bias power supply 22. Such a configuration is suitable for anisotropic etching.

Furthermore, it is also preferable to attach a cooler to the holding means 2 to suppress the increase of temperature of the processed object W, if needed.

Since parts having the same reference symbols as those of parts shown in FIGS. 1 and 2 are the same as those in the apparatus of the embodiment in FIG. 1, their detailed description will be omitted.

FIG. 5 shows another example of a plate with slots for a microwave source used in the present invention.

The example in FIG. 4 differs from the plate shown in FIG. 2 in that one slot 33 and one slot 43 are provided on the same straight line.

These slots 33 and 43 are provides so that lines C2 and C5 connecting centers thereof are unevenly distributed in the inside and outside of a line C1 connecting centers of the circular wave guide 13.

Since each pair of slot 33 and slot 43 in the same radial direction is formed in the shape of a discontinuous straight line, a microwave can be uniformly emitted in the radial direction rather than the case of the conventional slot. Moreover, this type of slot can emit a microwave in a circumferential direction (proceeding direction of the microwave) more uniformly than the case where the slot 33 and the slot 43 are unified into an oblong slot.

The eccentricity of slots used in the present invention is suitably determined according to the processing conditions to be used. If the plate 23 with slots is constituted to be exchangeable for a conductive base having a concavity serving as the wave guide 13, it becomes possible also to respond to a change of processing conditions flexibly.

If a center of each slot is unevenly arranged in the inner and/or outer directions to each center of the wave guide, the shape of an eccentric slot which is used in the present invention and whose center differs from the corresponding center of the circular wave guide can be applied just in one rectangular hole or a plurality of holes whose individual length is ¼ to ⅜ of guide wavelength and is arranged discontinuously on a straight line.

Figure 6:
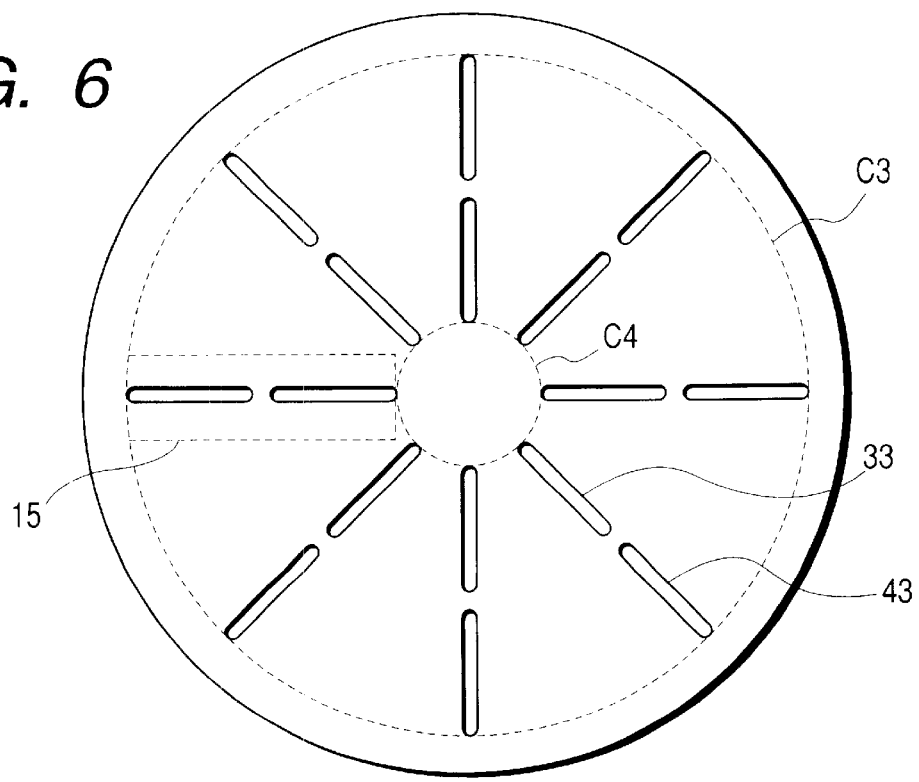
FIG. 6 is a plan showing another example of a plate with slots used in the present invention.

Moreover, FIG. 6 shows another plate with slots. In either cases, the light shielding film 45 being the same as that used in the embodiment described above is attached to the microwave permeable window 4, and it is good to assemble the apparatus so as to cover the plate with slots with the permeable window 4 so that the light shielding film 45 becomes in the plasma generating side.

(Embodiment 3)

Next, an embodiment of a dielectric for a microwave permeable window used in the present invention is described.

Slurry is prepared by adding sintering additives consisting of rare earth element oxide such as $Y_2O_3$, alkaline earth metal oxide such as CaO, rare earth element halogenide such as $YF_3$, and the like to high grade AlN powder having a specific surface area of 2.4 to 3.0 m²/g and the quantity of metal impurities of 1000 ppm or less, and further adding a polyvinyl alcoholic binder in an alcoholic organic solvent. The slurry obtained is granulated with using a spray dryer. Granulated powder is formed with mold dies in the shape of a disk or a rectangular solid, and is further fixed by hydrostatic pressing. The compact obtained is calcinated at 1650 to 2050° C. in $N_2$ atmosphere, and then, an aluminum nitride sintered-compact is obtained.

The sintered-compact obtained is roughly ground with a diamond grindstone, and subsequently, is finely finished. Then, the sintered-compact is polished with using a surface plate made of cast iron in a lapping machine, and in order to grind the sintered-compact more finely, the sintered-compact is finely finished with using a copper surface plate. In this way, it is possible to obtain the base material of a microwave permeable window consisting of the aluminum nitride sintered-compact that has the average surface roughness of 0.5 $\mu$m or less and average diameter of crystal grains of sintered structure in a range of 1 to 20 $\mu$m.

Then, by evaporation coating, ion plating, CVD, or sputtering, a layer having a low refraction index is formed in the surface of the obtained base material of the microwave permeable window, and a layer having a high refraction index is formed on it. Furthermore, six to twenty layers of these layers may be formed by alternately repeating the above steps by turns.

In this way, it is possible to obtain a dielectric for a high frequency energy permeable window with a reflective film according to the present invention.

(Embodiment 4)

Slurry is prepared by adding sintering additives consisting of rare earth element oxide such as $Y_2O_3$, alkaline earth metal oxide such as CaO, rare earth element halogenide such as $YF_3$, and the like to high grade AlN powder having a specific surface area of 2.4 to 3.0 m$^2$/g and the quantity of metal impurities of 1000 ppm or less, and further adding a polyvinyl alcoholic binder in an alcoholic organic solvent. The slurry obtained is granulated with using a spray dryer. Granulated powder is formed with mold dies in the shape of a disk or a rectangular solid, and is further fixed by hydrostatic pressing. The compact obtained is calcinated at 1650 to 2050° C. in $N_2$ atmosphere, and then, an aluminum nitride sintered-compact is obtained.

The sintered-compact obtained is roughly ground with a diamond grindstone, and subsequently, is finely finished. Then, the sintered-compact is polished with using a surface plate made of cast iron in a lapping machine, and in order to grind the sintered-compact more finely, the sintered-compact is finely finished with using a copper surface plate. In this way, it is possible to obtain the base material of a microwave permeable window consisting of the aluminum nitride sintered-compact that has the average surface roughness of 0.5 $\mu$m or less and average diameter of crystal grains of sintered structure in a range of 1 to 20 $\mu$m.

Then, by CVD or sputtering, an optical absorption layer consisting of amorphous silicon, silicon nitride, which is silicon rich more than a stoichiometric ratio, and the like is formed on a surface of the base material of the microwave permeable window obtained. Furthermore, an aluminum oxide film that serves as a protection layer is formed by sputtering.

In this way, it is possible to obtain a dielectric for a high frequency energy permeable window with an optical absorption film according to the present invention.

In each embodiment of the present invention described above, although a board (plate)-like dielectric for a high frequency energy permeable window is described, the shape is not limited to them and is also good even if the shape is a curved surface such as a dome, or a semi-sphere.

What is necessary in the circular wave guide used for the high frequency energy source according to the present invention is circular, and hence the shape is not limited to a circle, but may be various, for example, an ellipse ring, a rectangular ring, a pentagonal ring, and the like.

When processing a processed object having the shape of a disk like a semiconductor wafer, an optical disk, or a magnetic disk, the shape of a circular ring is suitable.

It is also preferable to use an assembly of a conductive base, having a circular concavity used as a wave guide, and a plate with slots as a high frequency energy source having the circular wave guide used in the present invention.

Moreover, it is also preferable to be filled up with a dielectric in a wave guide to shorten a guide wavelength, if needed. As such a dielectric, a resin such as tetrafluoroethylene is used preferably.

The preferable length of one slot used in the present invention is ¼ to ⅜ of a guide wavelength that is applicable.

The material quality of the plate with slots and the circular wave guide that are used in the present invention is just a conductor. Nevertheless, in order to suppress the propagation loss of high frequency energy as much as possible, aluminum, Cu, or stainless steel on which Ag/Cu is plated, which have high conductivity, is optimal. So long as the direction of the introductory port to the circular wave guide used in the present invention can introduce high frequency energy into the high frequency energy propagation space in a circular wave guide efficiently, the direction which can introduce high frequency energy in parallel with an H-plane like H-plane T-junction or tangent introduction, or the direction which can be introduced at a right angle to an H-plane like E-plane T-junction is also good. An optimal slot interval in the microwave proceeding direction used in the present invention is ½ or ¼ of a guide wavelength.

Although the high frequency energy source having a circular wave guide is described above, the high frequency energy source used in the present invention is not limited to this type, but may be a high frequency energy source consisting of above-described RLSA, a cylindrical resonator, and a rectangle resonator. Alternatively, it may be a rod antenna.

Although a microwave or a VHF wave is used as the high frequency energy used in the present invention, more preferably, it is good to use a microwave which can be suitably chosen from a range of 0.8 GHz to 20 GHz.

Aluminum nitride is preferable as a dielectric for a high frequency energy permeable window used in the present invention. Nevertheless, it is also possible to apply quartz glass, other various types of glass such as an $SiO_2$ system, an inorganic substance such as $Si3N_4$, NaCl, KCl, LiF, $CaF_2$, $BaF_2$, $Al_2O_3$, or MgO, or a film or sheet of an organic substance, such as polyethylene, polyester, polycarbonate, cellulose acetate, polypropylene, polyvinyl chloride, polyvinylidene chloride, polystyrene, polyamide, or polyimide.

In the plasma processing apparatus and processing method according to the present invention, magnetic field generating means can be also used. As a magnetic field used in the present invention, although a mirror magnetic field etc. is applicable, a magnetic field generated by a magnetron is optimal because the magnetic field generated by a magnetron has the flux density of a magnetic field near the slot that is stronger than the flux density of a magnetic field near the base. A permanent magnet except a coil can also be used as magnetic field generating means. When using a coil, it is also good to use other cooling means such as a water-cooled mechanism or air-cooling for overheating prevention.

Moreover, it is also good to emit ultraviolet light on a surface of a processed base for quality improvement of processing. What is applicable as a light source is just a source emitting light that is absorbed by a processed object or a gas adhering thereon, and hence, an excimer laser, an excimer lamp, a rare gas resonance line lamp, a low-pressure mercury lamp, etc. are adequate.

The pressure of the plasma processing chamber according to the present invention can be chosen from a range of $1.33 \times 10^{-2}$ Pa to $1.33 \times 10^3$ Pa. More preferably, the pressure can be chosen from a range of $1.33 \times 10^{-1}$ Pa or $1.33 \times 10^1$ Pa in CVD, a range of $6.65 \times 10^{-2}$ Pa to 6.65 Pa in etching, or a range of $1.33 \times 10^1$ Pa to $1.33 \times 10^3$ Pa in ashing.

A plasma processing method according to the present invention will be described with reference to FIGS. 7A to 7E and 8A to 8C.

Figure 7A:
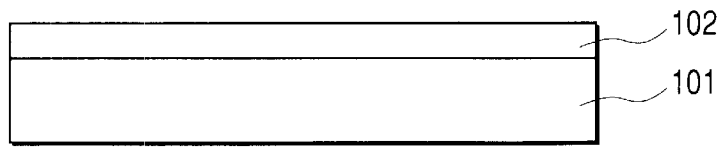
FIGS. 7A, 7B, 7C, 7D and 7E are schematic diagrams showing an example of manufacturing process steps of an element where a plasma processing method according to the present invention is used.

As shown in FIG. 7A, an insulating film 102 consisting of inorganic substances, such as silicon oxide, silicon nitride, nitrided silicon oxide, aluminum oxide, and tantalum oxide, or an organic substance such as tetrafluoroethylene, and polyarylether is formed on a surface of a processed object 101 like a silicon substrate with a CVD system or a surface treatment apparatus.

Figure 7B:
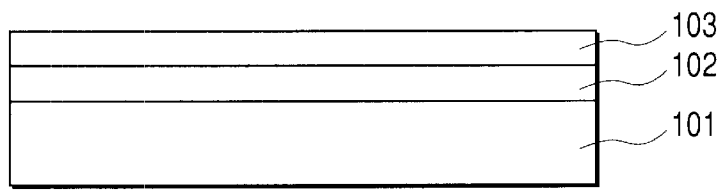

As shown in FIG. 7B, a photo resist layer 103 is formed by applying and baking photo resist.

Figure 7C:
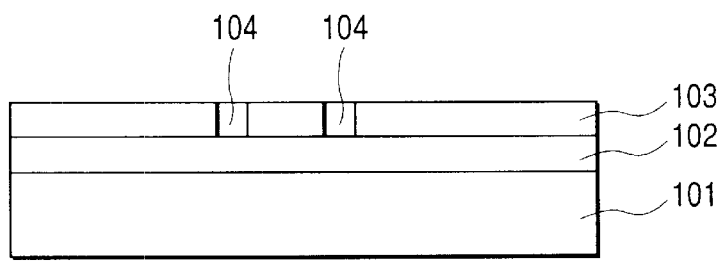

As shown in FIG. 7C, a mask pattern 103' having holes 104 is formed by forming a hole pattern latent image with an aligner and developing this.

Figure 7D:
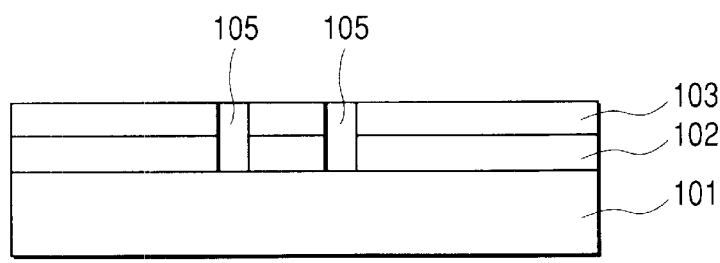

As shown in FIG. 7D, holes 105 are formed by etching the insulating film 102 under the mask pattern 103' by an etching system.

Figure 7E:
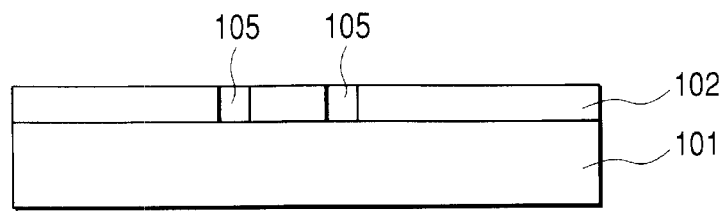

As shown in FIG. 7E, the mask pattern 1031 is removed by ashing with using an ashing system.

In this way, a structure having the insulating film with holes is obtained.

Then, when making a conductor etc. deposited in each hole, it is also preferable to clean the inside of the hole with a cleaning apparatus etc. beforehand.

In addition, the plasma processing apparatus according to the present invention described with reference to the FIGS. 1 to 6 can be used as at least one of a CVD system, surface treatment apparatus, an etching system, and an ashing system that are used in the process described above.

Figure 8A:
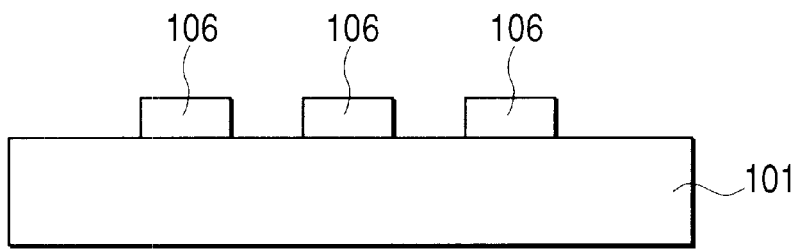
FIGS. 8A, 8B and 8C are schematic diagrams showing another example of manufacturing process steps of an element where a plasma processing method according to the present invention is used.
Figure 8B:
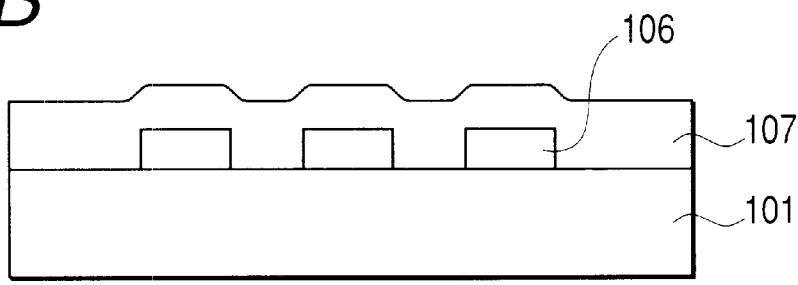
Figure 8C:
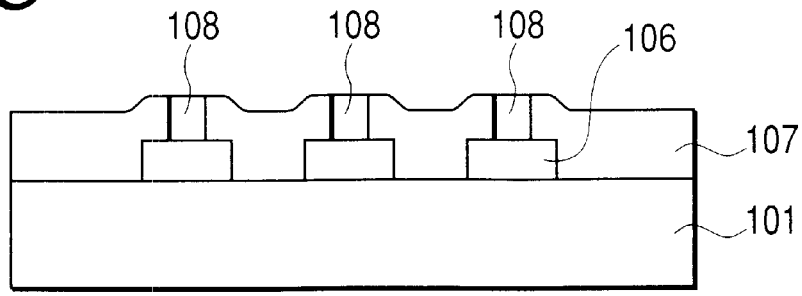
Figure 9:
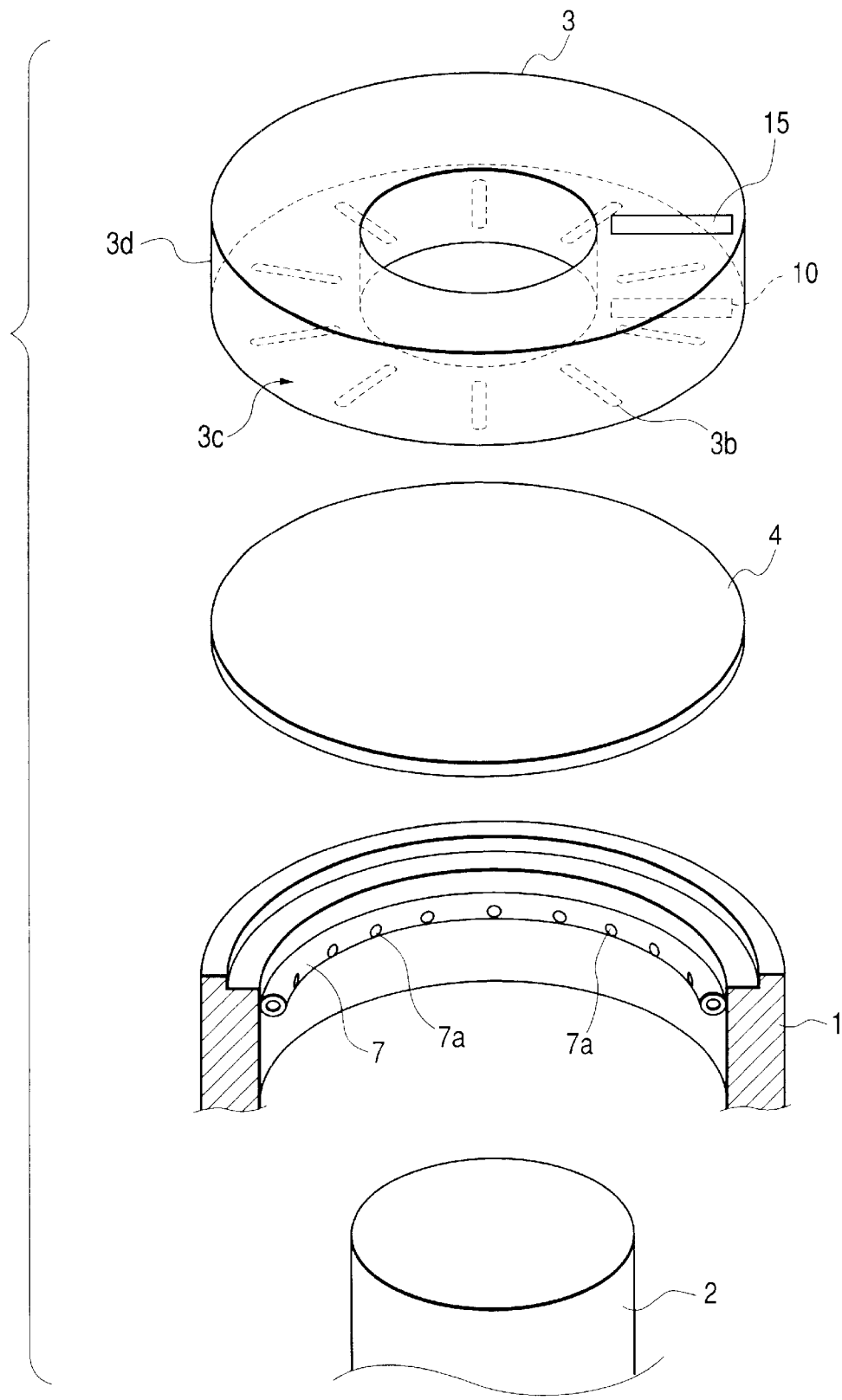
FIG. 9 is a schematic diagram showing the configuration of a plasma processing apparatus.
Figure 10:
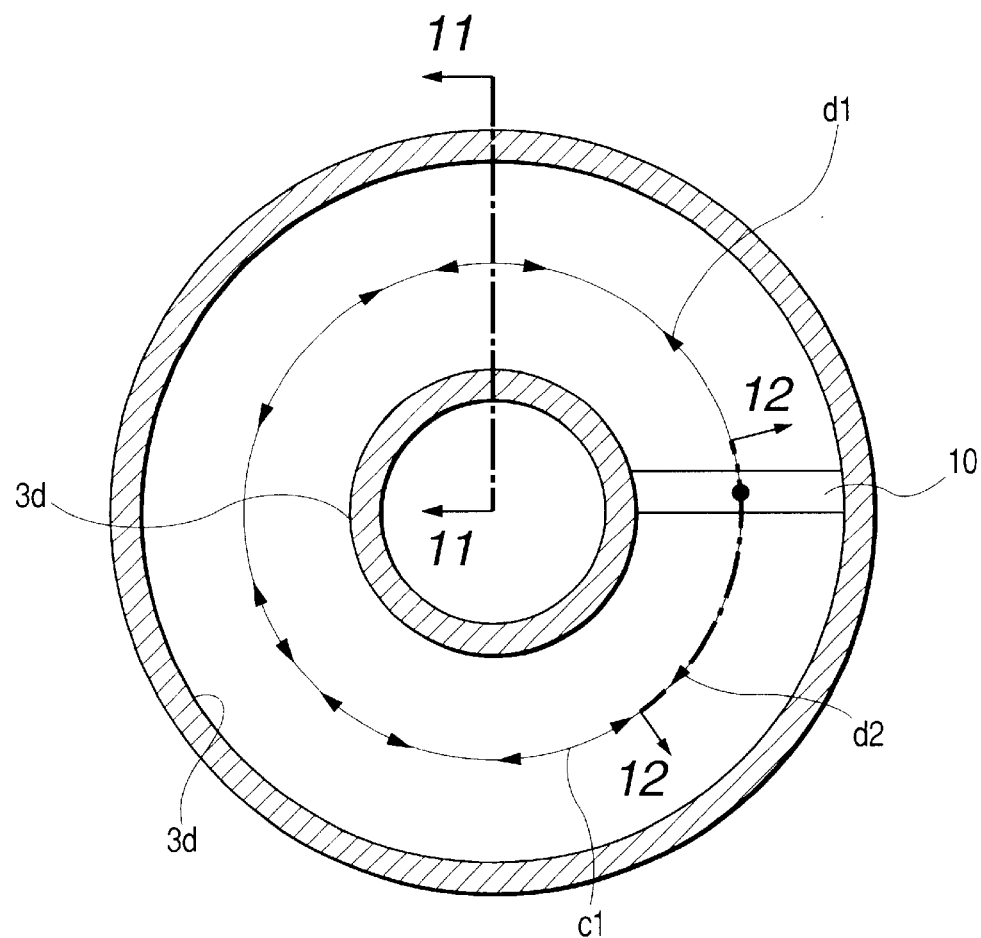
FIG. 10 is a sectional view of a microwave supply device.
Figure 11:
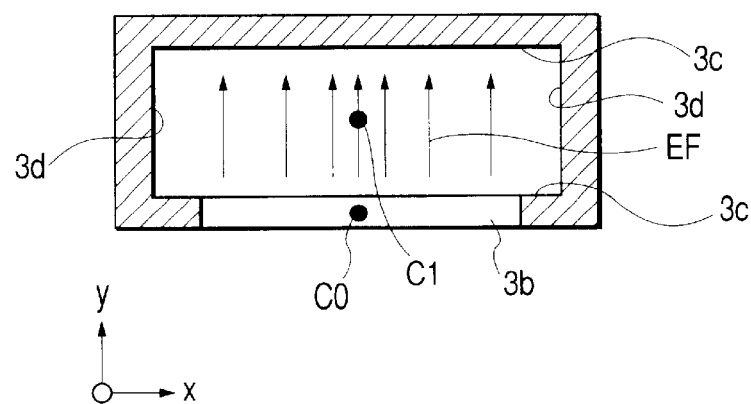
FIG. 11 is a sectional view of a wave guide that is taken on line 11—11 in FIG. 10.

FIGS. 8A to 8C show another plasma processing method according to the present invention.

As shown in FIG. 8A, a conductive pattern consisting of metal such as aluminum, copper, molybdenum, chromium, and tungsten, or each alloy whose principal component is at least one of these metal, or a polycrystal silicon pattern (here, lines and spaces) is formed.

As shown in FIG. 8B, an insulating film 107 is formed by a CVD system etc. Here, it is also good to make its surface flat by performing chemical mechanical polish for this insulating film 107 if needed.

After forming a mask pattern not shown, holes 108 are formed in the insulating film 107 by an etching system.

The structure as shown in FIG. 8C is obtained by removing the mask pattern by an ashing system etc.

Then, although the plasma processing apparatus according to the present invention can be used as the CVD system, etching system, and ashing device, which are described above, the plasma processing apparatus is not limitedly applied only to these as described later.

The wave plasma processing method according to the present invention can efficiently form insulating films such as $Si_3N_4$, $SiO_2$, $Ta_2O_5$, $TiO_2$, TiN, $Al_2O_3$, AlN, $MgF_2$, and fluorocarbon; semiconductor films such as a-Si, poly-Si, SiC, and GaAs; metal films such as Al, W, Mo, Ti, and Ta; and various kinds of deposition films such as amorphous carbon, diamond-like carbon, and diamond, by suitably choosing a gas to be used.

A base of the processed object processed with the plasma processing method according to the present invention can be a semiconductor, a conductor, or an electric insulator. Specifically, semiconductor substrates such as a Si wafer and a silicon-on-insulator wafer are cited.

Metal such as Fe, Ni, Cr, Al, Mo, Au, Nb, Ta, V, Ti, Pt, and Pb, or alloys of these metal, for example, brass and stainless steel are cited as a conductive base.

Quartz glass and other various glass; inorganic substances such as $Si_3N_4$, NaCl, KCl, LiF, $CaF_2$, $BaF_2$, $Al_2O_3$, and MgO; and films or sheets of organic substances such as polyethylene, polyester, polycarbonate, cellulose acetate, polypropylene, polyvinyl chloride, polyvinylidene chloride, polystyrene, polyamide, or polyimide are cited as an insulating base.

In regard to a gas used when forming a thin film on a substrate with a CVD method, organic metal such as trimethylaluminum (TMAl), triethylaluminum (TEAl), triisobutylaluminum (TIBAl), dimethyl aluminum hydride (DMAlH), tungsten carbonyl ($W(CO)_6$), molybdenum carbonyl ($Mo(CO)_6$), trimethylgallium (TMGa), and triethylgallium (TEGa); and halogenation metal such as $AlCl_3$, $WF_6$, $TiCl_4$, and $TaCl_5$ are cited as raw material containing a metal atom in the case of forming a common thin film. Moreover, $O_2$, $O_3$, $H_2$, O, NO, $N_2O_1$, $NO_2$, $N_2$, $NH_3$, $N_2H_4$, a hexamethyldisilazane (HMDS), etc. are cited as an oxygen raw material gas or a nitrogen raw material gas that is introduced simultaneously in this case.

When forming a carbon film such as amorphous carbon, diamond-like carbon, and diamond, a gas with a carbon content such as of $CH_4$ and $C_2H_6$ can be used and, when forming a fluorocarbon film, a gas with fluorine and carbon contents such as $CF_4$ and $C_2F_6$ can be used.

$F_2$, $CF_4$, $CH_2F_2$, $C_2F_6$, $C_4F_8$, $CF_2Cl_2$, $SF_6$, $NF_3$, $Cl_2$, $CCl_4$, $CH_2Cl_2$, $C_2Cl_6$, etc. are cited as an etching gas when etching a surface of a base.

$O_2$, $O_3$, $H_2O$, $N_2$, NO, $N_2O$, $NO_2$, etc. are cited as an ashing gas when ashing and removing an organic component, such as photo resist, on the surface of the base.

Moreover, when the microwave plasma processing apparatus and processing method according to the present invention are applied also to surface treatment. With using, for example, Si, Al, Ti, Zn, Ta, etc. as a base or a surface layer, oxidation treatment, nitriding, or doping processing of B, As, P, etc., for a base or a surface layer is possible by suitably choosing a gas to be used. Furthermore, the present invention is also applicable to a cleaning method. In this case, it can be also used for the cleaning which removes oxide or organic substances, heavy metal, etc.

$O_2$, $O_3$, $H_2O$, NO, $N_2O$, $NO_2$, etc. are cited as an oxidizing gas in the case of performing the surface oxidization processing of a base. Moreover, $N_2$, $NH_3$, $N_2H_4$, hexamethyldisilazane (HMDS), etc. are cited as a nitriding gas in the case of performing the surface nitriding processing of the base.

A well-known gas can be used in the case of cleaning an organic substance, or on a surface of a base such as photo resist.

As a raw material gas containing Si atoms in the case of forming Si system semiconductor thin films such as a-Si, poly-Si, and SiC, substances which are gases in standard temperature and pressure or can be easily gasified are cited, which are inorganic silanes such as $SiH_4$ and $Si_2H_6$; organic silanes such as tetraethylsilane (TES), tetramethylsilane (TMS), dimethylsilane (DMS), dimethyl fluorosilane (DMDFS), and dimethyldichlorosilane (DMDCS); silane halides such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, and $SiCl_2F_2$; and the like. Moreover, as an additive gas or a carrier gas that can be introduced with being mixed with a Si raw material gas in this case, $H_2$, He, Ne, Ar, Kr, Xe, and Rn are cited.

As raw material containing Si atoms in the case of forming a Si compound system of thin film, such as $Si_3N_4$ and $SiO_2$, substances which are gases in standard temperature and pressure or can be easily gasified are cited, which are inorganic silanes such as $SiH_4$ and $Si_2H_6$; organic silanes such as tetraethoxysilane (TEOS), tetramethoxysilane (TMOS), octamethylcyclotetrasilane (OMCTS), dimethylfluorosilane (DMDFS), and dimethyldichlorosilane (DMDCS); silane halides such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, and $SiCl_2F_2$; and the like. Moreover, as a nitrogen raw material gas or an oxygen raw material gas that is introduced simultaneously in this case, $N_2$, $NH_3$, $N_2H_4$, hexamethyldisilazane (HMDS), $O_2$, $O_3$, $H_2O$, NO, $N_2O$, $NO_2$, etc. are cited.

Organic metal such as trimethylaluminum (TMAl), triethylaluminum (TEAl), triusobutylaluminum (TIBAl), dimethyl aluminum hydride (DMAlH), tungsten carbonyl $(W(CO)_6)$, molybdenum carbonyl $(Mo(CO)_6)$, trimethylgallium (TMGa), and triethylgallium (TEGa); and halogenation metal such as $AlCl_3$, $WF_6$, $TiCl_4$, and $TaCl_3$ are cited as raw material containing metal atoms in the case of forming a thin film of metal such as Al, W, Mo, Ti, and Ta. Moreover, as an additive gas or a carrier gas that can be introduced with being mixed with a Si raw material gas in this case, $H_2$, He, Ne, Ar, Kr, Xe, and Rn are cited.

$O_2$, $O_3$, $H_2O$, $N_2$, NO, $N_2O$, $NO_2$, etc. are cited as a cleaning/ashing gas when ashing and removing an organic component on a surface of compounds of metal such as $Al_2O_3$, AlN and $Ta_2O_5$, $TiO^2$, TiN, and $WO_3$, $F_2$, $CF_4$, $CH_2F_2$, $C_2F_6$, $C_4F_8$, $CF_2Cl_{21}$ $SF_6$, $NF_3$, etc. are cited as a cleaning gas when cleaning inorganic substances on a surface of the base.

EXAMPLES

Example 1

In this example, an apparatus configured as shown in FIGS. 4 to 6 was produced, and plasma was generated.

In a conductive member made of aluminum, a ring groove for circular waveguide were formed, the circular waveguide which each have a cross section that is perpendicular to the proceeding direction of a microwave and is a rectangle cross section, 27 mm high and s 96 mm wide, and serve as a non-termination circular wave guide 13 in a circle whose circumference is 4 times of guide wavelength (159 mm), i.e., 202 mm in diameter.

The size of a rectangular slot is 40 mm long×400 wide, two slots were arranged in line as a set so that their interval became a half of guide wavelength, and eight sets were formed on a conductive plate to produce an aluminum plate 23 with the slots as shown in FIG. 6.

A microwave supply device as shown in FIG. 4 was produced with combining the conductive member and conductive plate with slots.

An aluminum nitride disk was formed by processing a ceramic sintered-compact consisting of aluminum nitride was processed, its surface was coated with a 69-nm thick aluminum oxide layer, and the surface was further coated with a 84-nm thick magnesium fluoride layer. The absorptivity of an effective wavelength range of this laminated object was 425 nm to 515 nm, and the average reflectance was 97%. This was used for the dielectric window 4.

Experimentally, a probe was arranged in the space 9 and 100 sccm of argon gas is introduced from the gas supply way 7 after exhausting the inside of the space 9.

The pressure in the space 9 was maintained to 1.33 Pa by adjusting a conductance valve in an exhaust system and a mass flow controller in a gas supply system.

A 2.45 GHz and 3.0 kW microwave was introduced into the microwave supply device 3 in the $TE_{10}$ mode from the wave guide 5 through a 4E tuner, a directional coupler, and an isolator.

Electron density was measured using a Langmuir probe that can be scanned. In both timing, that is, at the time of discharge start, and after 60 minutes, the electron density was $2.5 \times 10^{12}/cm^3$.

Example 2

As a microwave permeable window 4, first, a set of an aluminum oxide layer and a magnesium fluoride layer was formed on a surface of the ceramic sintered-compact disk consisting of aluminum nitride by sputtering, and sixteen layers were totally formed with making layer thickness gradually increase.

The aluminum oxide layer was made thickness thereof to increase from 67 nm to 81 nm. The magnesium fluoride layer was made thickness thereof to increase from 82 nm to 99 nm.

The effective wavelength range of this laminating object was 400 nm to 600 nm, and the average reflectance was 91%. Then, a plasma processing apparatus as shown in FIGS. 4 and 6 was prepared similarly to the Example 1.

Similarly to the Example 1, when the electron density was measured at the time of discharge start and after 60 minutes, all were $2.2 \times 10^{12}/cm^3$.

Example 3

The microwave plasma processing apparatus shown in the FIG. 1 was used, and ashing of photo resist was performed according to the following procedure. A microwave permeable window used had the configuration being the same as that of the window in the Example 1.

A substrate used as the processed object W was a silicon substrate (diameter: 300 mm) that was just after forming via holes after etching an insulating film consisting of a silicon oxide under a photo resist pattern. First, after installing a silicon substrate on the holding means 2, the silicon substrate was heated to 200° C., and the inside of the container 1 was exhausted through an exhaust system and was made to be decompressed up to $1.33 \times 10^{-3}$ Pa. An oxygen gas was introduced into the container 1 at a flow rate of 2 slm through the process gas supply port 17. Subsequently, a conductance valve 28 provided in the exhaust system was adjusted, and the inside of the container 1 was kept to 133 Pa. In the container 1, power (2.5 kW and 2.45 GHz) was supplied through the microwave supply device 3 from the microwave power supply 6. In this way, plasma was generated in the space 9. At this time, the oxygen gas introduced through the process gas supply port 17 became ozone in the space 9, and was transferred in the direction of the silicon substrate W, and the photo resist on the substrate W was oxidized, evaporated, and removed. After ashing, ashing speed, surface density of charge on the substrate surface, etc. were evaluated.

The ashing speed and uniformity that were obtained were excellent, and were 6.3 μm/min (no difference between lots). Surface density of charge was $0.5 \times 10^{11}$/cm$^2$, and hence a sufficiently low value was shown.

Example 4

The microwave plasma processing apparatus shown in the FIG. 1 was used, and the ashing of photo resist was performed.

The microwave permeable window used was a window having the same configuration as that used in the Example 2, and a processed object and a processing method were the same as those in the Example 3.

The ashing speed and uniformity that were obtained were 8.6 μm/min (no difference between lots). Surface density of charge was $1.2 \times 10^{11}$/cm$^2$, and hence a sufficiently low value was shown.

Example 5

The microwave plasma processing apparatus shown in FIG. 4 was used, and a silicon nitride film for semiconductor device protection was formed in the following procedure. A microwave permeable window used had the configuration being the same as that of the window in the Example 1.

A P-type single crystal silicon substrate (orientation: <100>, specific resistance: 10 Ω·cm, diameter: 300 mm) with an isolation film consisting of a silicon oxide on which an aluminum circuit pattern, whose line and space were 0.5 μm and 0.5 μm respectively, was formed was used as the processed object W. First, after placing the silicon substrate on the holding means 2, the inside of the container 1 was exhausted through the exhaust system, and was made to be decompressed to $1.33 \times 10^{-5}$ Pa. Then, the silicon substrate was heated and held at 300° C. by energizing a heater (not shown) attached to the holding means 2. Through the process gas supply port 17, a nitrogen gas and a monosilane gas were introduced at flow rates of 600 sccm and 200 sccm respectively into the container 1. Subsequently, the conductance valve 28 provided in the exhaust system was adjusted, and the inside of the container 1 was kept to 2.66 Pa. Further, 3.0 kW and 2.45 GHz power was supplied in the TE$_{10}$ mode through the microwave supply device 3 from the microwave power supply 6. In this way, plasma was generated in the space 9. At this time, the nitrogen gas introduced through the process gas supply port 17 was excited, dissociated, and ionized in the space 9, and became active species, was transferred in the direction of the silicon substrate, and reacted with the monosilane gas, and the silicon nitride film was formed at the thickness of 1.0 μm on the silicon substrate. Film qualities such as film formation speed and stress were evaluated. The stress was acquired by measuring a change of the amount of curvatures of the substrate before and after film formation with a laser interferometer, Zygo (trade name).

The film formation speed of the silicon nitride film obtained was 620 nm/min (no difference between lots). The stress was $1.1 \times 10^9$ dyne/cm$^2$ (compression), leakage current was $1.2 \times 10^{-10}$ A/cm$^2$, and withstand voltage was 10.3 MV/cm, and hence it was verified that this film was excellent.

Example 6

The microwave plasma processing apparatus shown in FIG. 4 was used, and a silicon oxide film and a silicon nitride film for plastic lens protection were formed in the following procedure.

A microwave permeable window used had the configuration being the same as that of the window in the Example 2.

As the processed object W, a 50-mm-diameter plastic convex lens was used. First, after installing the lens on the holding means 2, the inside of the container 1 was exhausted through the exhaust system, and was made to be decompressed to $1.33 \times 10^{-5}$ Pa. Through the process gas supply port 17, a nitrogen gas and a monosilane gas were introduced at flow rates of 150 sccm and 100 sccm respectively into the container 1. Subsequently, a conductance valve 8 provided in the exhaust system was adjusted, and the inside of the container 1 was held to $6.65 \times 10^{-1}$ Pa. Further, 3.0 kW and 2.45 GHz power was supplied in the TE$_{10}$ mode through the microwave supply device 3 from the microwave power supply 6.

In this way, plasma was generated in the space 9. At this time, the nitrogen gas introduced through the process gas supply port 17 was excited, dissociated, and ionized in the space 9, and became active species such as nitrogen atoms, was transferred in the direction of the lens, and reacted with the monosilane gas, and the silicon nitride film was formed at the thickness of 20 nm on the lens.

Through the process gas supply port 17, an oxygen gas and a monosilane gas were introduced at flow rates of 200 sccm and 100 sccm respectively into the container 1. Subsequently, a conductance valve 8 provided in the exhaust system was adjusted, and the inside of the container 1 was kept to $1.33 \times 10^{-1}$ Pa. Further, 2.0 kW and 2.45 GHz power was supplied through the microwave supply device 3 from the microwave power supply 6 to the container 1. In this way, plasma was generated in the space 9. At this time, the oxygen gas introduced through the process gas supply port 17 was excited, dissociated, and ionized in the space 9, and became active species such as oxygen atoms, was transferred in the direction of the lens, and reacted with the monosilane gas, and the silicon oxide film was formed at the thickness of 85 nm on the lens.

Film formation speed and reflection property were evaluated. The film formation speed of the silicon nitride film and silicon oxide film was 370 nm/min (no difference between lots) and 400 nm/min respectively. Moreover, the reflection factor at the wavelength of near 500 nm was 0.17%, and it is verified that this film had excellent optical property.

Example 7

The microwave plasma processing apparatus shown in FIG. 4 was used, and an interlayer isolation film for a semiconductor device was formed in the following procedure. A microwave permeable window used had the configuration being the same as that of the window in the Example 1.

A P-type single crystal silicon substrate (orientation: <100>, specific resistance: 10 Ω·cm, diameter: 300 mm) on which an aluminum circuit pattern, whose line and space were 0.5 μm and 0.5 μm respectively, was formed on its top surface was used as the processed object W. This silicon substrate was placed on the holding means. The inside of the container 1 was exhausted through the exhaust system, and was made to be decompressed up to $1.33 \times 10^{-5}$ Pa. Then, the silicon substrate was heated and kept at 300° C. by energizing a heater attached to the holding means. Through the process gas supply port 17, an oxygen gas and a monosilane gas were introduced at flow rates of 500 sccm and 200 sccm respectively into the container 1. Subsequently, the conductance valve 8 provided in the exhaust system was adjusted, and the inside of the container 1 was kept to 4.00 Pa. Subsequently, while applying the high frequency power (300 W and 400 kHz) to the holding means 2 through bias voltage applying means attached to the holding means, 2.0 kW and 2.45 GHz power was supplied in the container 1 through the microwave supply device 3 in the $TE_{10}$ mode from the microwave power supply 6. In this way, plasma was generated in the space 9. The oxygen gas introduced through the process gas supply port 17 was excited, dissociated, and ionized in the space 9, and became active species, was transferred in the direction of the silicon substrate, and reacted with the monosilane gas, and the silicon oxide film was formed at the thickness of 0.8 μm on the silicon substrate. At this time, the ion species are accelerated by RF bias, enter into the substrate, and increase flatness by shaping the silicon oxide film on the aluminum pattern. Then, film formation speed, uniformity, withstand voltage, and step coverage were evaluated. The step coverage was evaluated by observing a cross section of the silicon oxide film formed on the aluminum pattern with a scanning electron microscope (SEM), and observing a void.

The film formation speed of the silicon oxide film obtained was 310 nm/min (no difference between lots). The withstand voltage was 9.1 MV/cm, there was no void, and hence it was verified that this film is excellent.

Example 8

The microwave plasma processing apparatus shown in FIG. 4 was used, and an interlayer isolation film for a semiconductor device was etched in the following procedure. A microwave permeable window used had the configuration being the same as that of the window in the Example 2.

A P-type single crystal silicon substrate (orientation: <100>, specific resistance: 10 Ω·cm, diameter: 300 mm) on which an aluminum circuit pattern, whose line and space were 0.35 μm and 0.35 μm respectively, was formed, an isolation film consisting of 1-um thick silicon oxide was formed thereon, and a photo resist pattern was formed further thereon was used as the processed object W. First, after placing the silicon substrate on the holding means 2, the inside of the container 1 was exhausted through the exhaust system, and was made to be decompressed to $1.33 \times 10^{-5}$ Pa. A mixed gas of $C_4F_8$, Ar, and $O_2$ whose volume ratio was 2:3:1 in order was introduced in the container 1 at the flow rate of 300 sccm through the process gas supply port 17. Subsequently, a conductance valve 8 provided in the exhaust system was adjusted, and the inside of the container 1 was kept to $6.65 \times 10^{-1}$ Pa. Subsequently, while applying the high frequency power (300 W and 400 kHz) to the holding means 2 through bias voltage applying means attached to the holding means, 2.0 kW and 2.45 GHz power was supplied in the container 1 through the microwave supply pipe 3 in the $TE_{10}$ mode from the microwave power supply. In this way, plasma was generated in the space 9. The $C_4F_8$ gas introduced through the process gas supply port 17 was excited, dissociated, and ionized in the space 9, and became active species, and was transferred in the direction of the silicon substrate, and holes were formed by etching the isolation film, made of silicon oxide, by ions accelerated by self bias. Substrate temperature rose only to 90° C. by the cooler (not shown) attached to the holding means 2. An etch rate, a selection ratio, and etched geometry were evaluated after etching. The etched geometry was observed and evaluated in regard to a cross section of the etched silicon oxide film with a scanning electron microscope (SEM).

The etch rate and silicon selection ratio for poly silicon were 720 nm/min (no difference between lots) and 20, respectively. The holes had the almost perpendicular side faces and it was verified that the micro loading effect was small.

Example 9

The microwave plasma processing apparatus shown in FIG. 4 was used, and an inter-gate electrode polysilicon film for a semiconductor device was etched in the following procedure. A microwave permeable window used had the configuration being the same as that of the window in the Example 1.

A P-type single crystal silicon substrate (orientation: <100>, specific resistance: 10 Ω·cm, diameter: 300 mm) on which a polysilicon film was formed on the top surface was used as the processed object W. First, after placing the silicon substrate on the holding means 2, the inside of the container 1 was exhausted through the exhaust system, and was made to be decompressed to $1.33 \times 10^{-5}$ Pa. A $CF_4$ gas and an oxygen gas were introduced into the container 1 at flow rates of 300 sccm and 20 sccm respectively, and the inside of the container 1 was kept at the pressure of about 0.27 Pa. Subsequently, while applying the high frequency power of 400 kHz and 300 W to the holding means 2, the microwave power of 2.45 GHz and 2.0 kW was supplied in the container 1 through the microwave supply device 3 in the $TE_{10}$ mode. In this way, plasma was generated in the container 1. The $CF_4$ gas introduced was excited, dissociated, and ionized in the container 1, and became active species, and was transferred in the direction of the silicon substrate, and the polysilicon film was etched by ions accelerated by self bias. At the time of processing, substrate temperature rose only to 80° C. by a cooler (not shown). An etch rate, a selection ratio, and etched geometry were evaluated at the time of etching. The etched geometry was observed and evaluated in regard to a cross section of the etched polysilicon film with a scanning electron microscope (SEM).

The etch rate and selection ratio to $SiO_2$ were 850 nm/min (no difference between lots) and 24 respectively, the etched geometry was also perpendicular, and hence it was verified that a micro loading effect was small.

Example 10

In this example, an apparatus configured as shown in FIGS. 4 to 6 was produced, and plasma was generated.

In a conductive member made of aluminum, circular slots were formed, the circular slots which each had a cross section that was perpendicular to the proceeding direction of a microwave and was a rectangle cross section, 27 mm high and s 96 mm wide, and serve as a circular wave guide 13 without termination in a circle whose circumference is 4 times of guide wavelength (159 mm), i.e., 202 mm in diameter.

The size of a rectangular slot is 40 mm long×400 wide, two slots were arranged in line as a set so that their interval became a half of guide wavelength, and eight sets were formed on a conductive plate to produce an aluminum plate 23 with the slots as shown in FIG. 6.

A microwave supply device as shown in FIG. 4 was produced with combining the conductive member and conductive plate with slots.

An aluminum nitride disk was formed by processing a ceramic sintered-compact consisting of aluminum nitride was processed, its surface was coated with a 540-nm thick amorphous silicon film, and the surface was further coated with a 480-nm thick aluminum oxide film. The absorptivity of this laminated object was an average of 93% in the wavelength range of 440 nm to 500 nm. This was used for the dielectric window 4.

Experimentally, a probe was arranged in the space 9 and 100 sccm of argon gas is introduced from the gas supply way 7 after exhausting the inside of the space 9.

The pressure in the space 9 was maintained to 1.33 Pa by adjusting a conductance valve in an exhaust system and a mass flow controller in a gas supply system.

A 2.45 GHz and 3.0 kW microwave was introduced into the microwave supply device 3 in the $TE_{10}$ mode from the wave guide 5 through a 4E tuner, a directional coupler, and an isolator.

Electron density was measured with using a Langmuir probe that could be scanned. In both timing, that is, at the time of discharge start, and after 60 minutes, the electron density was $2.3 \times 10^{12}/cm^3$.

Example 11

What was used as the microwave permeable window 4 was a ceramic sintered-compact consisting of aluminum nitride, on which 720-nm thick SiN film, which was silicon rich, that is, SixN film having more Si atoms than the amount determined by the stoichiometric ratio (x>¾), was formed by adding a small amount of nitrogen (ammonia can be used) to a silane gas and forming the SixN film by PCVD, and an aluminum oxide film with a thickness of 360 nm, which was formed on the SixN film by sputtering, were formed. The average absorptivity of this laminated object in the range of 440 nm to 500 nm was 86%. Then, a plasma processing apparatus as shown in FIGS. 4 and 6 was prepared similarly to Example 10.

Similarly to the Example 1, when the electron density was measured at the time of discharge start and after 60 minutes, all were $2.2 \times 10^{12}/cm^3$.

Example 12

The microwave plasma processing apparatus shown in the FIG. 1 was used, and the ashing of photo resist was performed as the following procedure. A microwave permeable window used had the configuration being the same as that of the window in the Example 10.

A substrate used as the processed object W was a silicon substrate (diameter of 300 mm) that was just after forming via holes after etching an insulating film consisting of a silicon oxide under a photo resist pattern. First, after placing the silicon substrate on the holding means 2, the silicon substrate was heated to 200° C., and the inside of the container 1 was exhausted through an exhaust system and was made to be decompressed up to $1.33 \times 10^{-3}$ Pa. An oxygen gas was introduced into the container 1 at the flow rate of 2 slm through the process gas supply port 17. Subsequently, the conductance valve 28 provided in the exhaust system was adjusted, and the inside of the container 1 was kept to 133 Pa. The 2.5 kW and 2.45 GHz power was supplied in the $TE_{10}$ mode through the microwave supply device 3 from the microwave power supply 6 into the container 1. In this way, plasma was generated in the space 9. At this time, the oxygen gas introduced through the process gas supply port 17 became ozone in the space 9, and was transferred in the direction of the silicon substrate W, and the photo resist on the substrate W was oxidized, evaporated, and removed. After ashing, ashing speed, substrate surface density of charge, etc. were evaluated.

The ashing speed and uniformity that were obtained were excellent, and were 6.5 μm/min (no difference between lots). Surface density of charge was $0.5 \times 10^{11}/cm^2$, and hence a sufficiently low value was shown.

Example 13

The microwave plasma processing apparatus shown in the FIG. 1 was used, and the ashing of photo resist was performed.

The microwave permeable window used was a window having the same configuration as that used in the Example 11, and a processed object and a processing method were the same as those in the Example 12.

The ashing speed and uniformity that were obtained were 8.9 μm/min (no difference between lots). Surface density of charge was $1.2 \times 10^{11}/cm^2$, and hence a sufficiently low value was shown.

Example 14

The microwave plasma processing apparatus shown in FIGS. 3A and 3B were used, and a silicon nitride film for semiconductor device protection was formed in the following procedure. A microwave permeable window used had the configuration being the same as that of the window in the Example 10.

A P-type single crystal silicon substrate (orientation: <100>, specific resistance: 10 Ω·cm, diameter: 300 mm) with an insulating film consisting of a silicon oxide on which an aluminum circuit pattern, whose line and space are 0.5 μm and 0.5 μm respectively, was used as the processed object W was used. First, after placing the silicon substrate on the holding means 2, the inside of the container 1 was exhausted through the exhaust system, and was made to be decompressed to $1.33 \times 10^{-5}$ Pa. Then, the silicon substrate was heated and kept at 300° C. by energizing a heater (not shown) attached to the holding means 2. Through the process gas supply port 17, a nitrogen gas and a monosilane gas were introduced at flow rates of 600 sccm and 200 sccm respectively into the container 1. Subsequently, the conductance valve 28 provided in the exhaust system was adjusted, and the inside of the container 1 was kept to 2.66 Pa. Further, 3.0 kW and 2.45 GHz power was supplied in the $TE_{10}$ mode through the microwave supply device 3 from the microwave power supply 6. In this way, plasma was generated in the space 9. At this time, the nitrogen gas introduced through the process gas supply port 17 was excited, dissociated, and ionized in the space 9, and became active species, was transferred in the direction of the silicon substrate, and reacted with the monosilane gas, and the silicon nitride film was formed at the thickness of 1.0 μm on the silicon substrate. Film qualities such as film formation speed and stress were evaluated. The stress was acquired by measuring a change of the amount of curvatures of the substrate before and after film formation with a laser interferometer, Zygo (trade name).

The film formation speed of the silicon nitride film obtained was 69 nm/min (no difference between lots). The stress was $1.1 \times 10^9$ dyne/cm$^2$ (compression), leakage current was $1.2 \times 10^{-10}$ A/cm$^2$, and withstand voltage was 10.8 MV/cm, and hence it was verified that this film was excellent.

Example 15

The microwave plasma processing apparatus shown in FIG. 4 was used, and a silicon oxide film and a silicon nitride film for plastic lens protection were formed in the following procedure.

A microwave permeable window used had the configuration being the same as that of the window in the Example 11.

As the processed object W, a 50-mm-diameter plastic convex lens was used. First, after placing the lens on the holding means 2, the inside of the container 1 was exhausted through the exhaust system, and was made to be decompressed to $1.33 \times 10^{-5}$ Pa. Through the process gas supply port 17, a nitrogen gas and a monosilane gas were introduced at flow rates of 150 sccm and 100 sccm respectively into the container 1. Subsequently, a conductance valve 8 provided in the exhaust system was adjusted, and the inside of the container 1 was held to $6.65 \times 10^{-1}$ Pa. Further, 3.0 kW and 2.45 GHz power was supplied through the microwave supply device 3 from the microwave power supply 6 to the container 1. In this way, plasma was generated in the space 9. At this time, the nitrogen gas introduced through the process gas supply port 17 was excited, dissociated, and ionized in the space 9, and became active species like nitrogen atoms and so on, was transferred in the direction of the lens, and reacted with the monosilane gas, and the silicon nitride film was formed at the thickness of 20 nm on the lens.

Through the process gas supply port 17, an oxygen gas and a monosilane gas were introduced at flow rates of 200 sccm and 100 sccm respectively into the container 1. Subsequently, a conductance valve 8 provided in the exhaust system was adjusted, and the inside of the container 1 was held to $1.33 \times 10^{-1}$ Pa. Further, 2.0 kW and 2.45 GHz power was supplied in the TE$_{10}$ mode through the microwave supply device 3 from the microwave power supply 6. In this way, plasma was generated in the space 9. At this time, the oxygen gas introduced through the process gas supply port 17 was excited, dissociated, and ionized in the space 9, and became active species such as oxygen atoms, was transferred in the direction of the lens, and reacted with the monosilane gas, and the silicon oxide film was formed at the thickness of 85 nm on the lens. Film formation speed and reflection property were evaluated.

The film formation speed of the silicon nitride film and silicon oxide film was 390 nm/min (no difference between lots) and 420 nm/min respectively. Moreover, the reflection factor at the wavelength of near 500 nm is 0.15%, and it was verified that the films had very good optical properties.

Example 16

The microwave plasma processing apparatus shown in FIG. 4 was used, and an interlayer isolation film for a semiconductor device was formed in the following procedure. A microwave permeable window used had the configuration being the same as that of the window in the Example 10.

A P-type single crystal silicon substrate (orientation: <100>, specific resistance: 10 Ω·cm, diameter: 300 mm) on which an aluminum circuit pattern, whose line and space were 0.5 μm and 0.5 μm respectively, was formed on the top surface was used as the processed object W. This silicon substrate was placed on the holding means. The inside of the container 1 was exhausted through the exhaust system, and was made to be decompressed up to $1.33 \times 10^{-5}$ Pa. Then, the silicon substrate was heated and kept at 300° C. by energizing a heater attached to the holding means. Through the process gas supply port 17, an oxygen gas and a monosilane gas were introduced at flow rates of 500 sccm and 200 sccm respectively into the container 1. Subsequently, the conductance valve 8 provided in the exhaust system was adjusted, and the inside of the container 1 was kept to 4.00 Pa. Subsequently, while applying the high frequency power of 300 W and 400 kHz to the holding means 2 through bias voltage applying means attached to the holding means, 2.0 kW and 2.45 GHz power was supplied in the container 1 through the microwave supply pipe 3 in the TE$_{10}$ mode from the microwave power supply 6. In this way, plasma was generated in the space 9. At this time, the oxygen gas introduced through the process gas supply port 17 was excited, dissociated, and ionized in the space 9, and became active species like oxygen atoms and so on, was transferred in the direction of the silicon substrate, and reacted with the monosilane gas, and the silicon oxide film was formed at the thickness of 0.8 μm on the silicon substrate. At this time, the ion species are accelerated by RF bias, enter into the substrate, and increase flatness by shaping the silicon oxide film on the aluminum pattern. Then, film formation speed, uniformity, withstand voltage, and step coverage were evaluated. The step coverage was evaluated by observing a cross section of the silicon oxide film formed on the aluminum pattern with a scanning electron microscope (SEM), and observing a void.

The film formation speed of the silicon oxide film obtained was 360 nm/min (no difference between lots). The withstand voltage was 9.1 MV/cm, there was no void, and hence it was verified that this film was excellent.

Example 17

The microwave plasma processing apparatus shown in FIG. 4 was used, and an interlayer isolation film for a semiconductor device was etched in the following procedure. A microwave permeable window used had the configuration being the same as that of the window in the Example 11.

A P-type single crystal silicon substrate (orientation: <100>, specific resistance: 10 Ω·cm, diameter: 300 mm) with an aluminum pattern, whose line and space are 0.35 μm and 0.35 μm respectively, an insulating film thereon, which consists of a silicon oxide and is 1 μm thick, and photo resist thereon was used as the processed object W was used. First, after placing the silicon substrate on the holding means 2, the inside of the container 1 was exhausted through the exhaust system, and was made to be decompressed to $1.33 \times 10^{-5}$ Pa. A mixed gas of $C_4F_8$, Ar, and $O_2$ whose volume ratio was 2:3:1 in order was introduced in the container 1 at the flow rate of 300 sccm through the process gas supply port 17. Subsequently, a conductance valve 8 provided in the exhaust system was adjusted, and the inside of the container 1 was kept to $6.65 \times 10^{-1}$ Pa. Subsequently, while applying the high frequency power of 300 W and 400 kHz to the holding means 2 through bias voltage applying means attached to the holding means, 2.0 kW and 2.45 GHz power was supplied in the container 1 through the microwave supply pipe 3 in the TE$_{10}$ mode from the microwave power supply. In this way, plasma was generated in the space 9. The $C_4F_8$ gas introduced through the process gas supply port 17 was excited, dissociated, and ionized in the space 9, and became active species, and was transferred in the direction of the silicon substrate, and holes were formed by etching the isolation film, made of silicon oxide, by ions accelerated by self bias. Substrate temperature rose only to 90° C. by the cooler (not shown) attached to the holding means 2. An etch rate, a selection ratio, and etched geometry were evaluated after etching. The etched geometry was observed and evaluated in regard to a cross section of the etched silicon oxide film with a scanning electron microscope (SEM).

The etch rate and silicon selection ratio for poly silicon were 540 nm/min (no difference between lots) and 20, respectively. The holes had almost perpendicular side faces and it was verified that the micro loading effect was also small.

Example 18

The microwave plasma processing apparatus shown in FIG. 4 was used, and an inter-gate electrode polysilicon film for a semiconductor device was etched in the following procedure. A microwave permeable window used had the configuration being the same as that of the window in the Example 10.

A P-type single crystal silicon substrate (orientation: <100>, specific resistance: 10 Ω·cm, diameter: 300 mm) on which the polysilicon film was formed on the top surface was used as the processed object W. First, after placing the silicon substrate on the holding means 2, the inside of the container 1 was exhausted through the exhaust system, and was made to be decompressed to $1.33 \times 10^{-5}$ Pa. A $CF_4$ gas and an oxygen gas were introduced into the container 1 at flow rates of 300 sccm and 20 sccm respectively, and the inside of the container 1 was kept at the pressure of about 0.27 Pa. Subsequently, while applying the high frequency power of 400 kHz and 300 W to the holding means 2, the microwave power of 2.45 GHz and 2.0 kW was supplied in the container 1 through the microwave supply device 3 in the $TE_{10}$ mode. In this way, plasma was generated in the container 1. The $CF_4$ gas introduced was excited, dissociated, and ionized in the container 9, and became active species, and was transferred in the direction of the silicon substrate, and the polysilicon film was etched by ions accelerated by self bias. At the time of processing, substrate temperature rose only to 80° C. by a cooler 414. The etch rate, selection ratio, and etched geometry were evaluated at the time of etching. The etched geometry was observed and evaluated in regard to a cross section of the etched polysilicon film with a scanning electron microscope (SEM).

The etch rate and selection ratio to $SiO_2$ were 820 nm/min (no difference between lots) and 24 respectively, etching geometry was also perpendicular, and hence it was verified that the micro loading effect was small.

According to the present invention, since the incidence of light that causes the aging of the dielectric loss to a microwave permeable window can be suppressed, time-dependent degradation of plasma processing characteristics can be suppressed.

What is claimed is:

1. A plasma processing apparatus comprising a container, a gas supply port for supplying a process gas to the container, a permeable window permeating high frequency energy for generating plasma of the gas and wherein a light shielding film for shielding said permeable window from light, which may increase dielectric loss of said permeable window, is provided on the internal surface of the permeable window.

2. The plasma processing apparatus according to claim 1, wherein a principal component of the permeable window is aluminum nitride.

3. The plasma processing apparatus according to claim 1, wherein the light shielding film contains a reflective film which reflects light at wavelength of 440 nm to 500 nm.

4. The plasma processing apparatus according to claim 1, wherein the light shielding film is a laminated object of a film with a low refraction index, and a film with a high refraction index.

5. The plasma processing apparatus according to claim 1, wherein a top surface of the light shielding film consists of a plasma-proof protective coat.

6. The plasma processing apparatus according to claim 1, wherein the light shielding film contains at least a kind of film chosen from among aluminum oxide, aluminum fluoride, magnesium fluoride, calcium fluoride, cerium fluoride, lanthanum fluoride, lithium fluoride, sodium fluoride, lead fluoride, and neodymium fluoride.

7. The plasma processing apparatus according to claim 1, wherein the high frequency energy is microwave energy.

8. The plasma processing apparatus according to claim 1, wherein the light shielding film contains an optical absorption film which absorbs light at wavelength of 440 nm to 500 nm.

9. The plasma processing apparatus according to claim 1, wherein the light shielding film is chosen from among Si, Ge, GaAs, InP, SiC, SiGe, CdS, CdTe, AgCl, TlCl, and C.

10. The plasma processing apparatus according to claim 1, wherein the light shielding film is silicon nitride film or glass with a metal ion content.

11. The plasma processing apparatus according to claim 1, wherein the light shielding film is a laminated object of two or more kinds of dielectric films.

12. The plasma processing apparatus according to claim 1, wherein a top surface of the light shielding film is chosen from among aluminum oxide, aluminum fluoride, magnesium fluoride, calcium fluoride, cerium fluoride, lanthanum fluoride, lithium fluoride, sodium fluoride, lead fluoride, and neodymium fluoride.

13. A plasma processing method for subjecting to plasma processing an object to be processed, comprising a step of subjecting to plasma processing the object to be processed with using the plasma processing apparatus according to claim 1.

14. The plasma processing method according to claim 13, wherein the plasma processing method is at least one method out of ashing, etching, cleaning, CVD, plasma polymerization, doping, oxidization, and nitriding.

15. A production method of a structure, comprising the steps of:

preparing the plasma processing apparatus according to claim 1;

placing an object to be processed in the plasma processing apparatus; and making plasma, accompanying emission of the light which may increase dielectric loss of the permeable window, generated by introducing at least one kind of gas, and supplying high frequency energy, and subjecting to plasma processing the object to be processed.

16. The production method of a structure according to claim 15, wherein the plasma processing method is at least one method out of ashing, etching, cleaning, CVD, plasma polymerization, doping, oxidization, and nitriding.

17. The production method of a structure according to claim 15, wherein the permeable window contains aluminum nitride as a principal component, the light shielding film has a film disturbing incidence of light at wavelength of 440 nm to 500 nm, and the plasma accompanies light at wavelength of 440 nm to 500 nm.

* * * * *

UNITED STATES PATENT AND TRADEMARK OFFICE
CERTIFICATE OF CORRECTION

PATENT NO.     : 6,677,549 B2
DATED          : January 13, 2004
INVENTOR(S)    : Nobumasa Suzuki et al.

It is certified that error appears in the above-identified patent and that said Letters Patent is hereby corrected as shown below:

Column 6,
Line 61, "to be made" should read -- converted into --.

Column 8,
Line 22, "are" should read -- is --.

Column 9,
Line 30, "is a," should read -- is α, --.

Column 10,
Line 25, "provides" should read -- provided --.

Column 13,
Line 33, "this" should read -- this pattern --; and
Line 37, "pattern 1031" should read pattern 103' --.

Column 14,
Line 36, "$N_2O_1$," should read -- $N_2O$, --.

Column 15,
Line 32, "triussobutylaluminum" should read -- triisobutylaluminum --;
Line 45, "$TiO^2$, should read -- TiO, --.
Line 46, ""$CF_2Cl_{21}$" should read -- "$CF_2Cl_2$, --; and
Line 59, "and s" should read -- and --.

UNITED STATES PATENT AND TRADEMARK OFFICE
CERTIFICATE OF CORRECTION

PATENT NO.   : 6,677,549 B2
DATED        : January 13, 2004
INVENTOR(S)  : Nobumasa Suzuki et al.

It is certified that error appears in the above-identified patent and that said Letters Patent is hereby corrected as shown below:

Column 25,
Line 5, "poly silicon" should read -- polysilicon --

Signed and Sealed this

Twenty-second Day of February, 2005

JON W. DUDAS
*Director of the United States Patent and Trademark Office*